(12) United States Patent
Yoon et al.

(10) Patent No.: US 9,076,534 B2
(45) Date of Patent: Jul. 7, 2015

(54) FLASH MEMORY DEVICE USING ADAPTIVE PROGRAM VERIFICATION SCHEME AND RELATED METHOD OF OPERATION

(71) Applicant: SAMSUNG ELECTRONICS CO., LTD., Suwon-si, Gyeonggi-do (KR)

(72) Inventors: Sang Yong Yoon, Seoul (KR); Ki Tae Park, Seongnam-si (KR); Moo Sung Kim, Yongin-si (KR); Bo Geun Kim, Suwon-si (KR); Hyun jun Yoon, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 173 days.

(21) Appl. No.: 13/841,503

(22) Filed: Mar. 15, 2013

(65) Prior Publication Data

US 2013/0208541 A1    Aug. 15, 2013

Related U.S. Application Data

(63) Continuation of application No. 12/963,867, filed on Dec. 9, 2010, now Pat. No. 8,411,502.

(30) Foreign Application Priority Data

Feb. 11, 2010    (KR) .................. 10-2010-0012894

(51) Int. Cl.
  *G11C 16/10* (2006.01)
  *G11C 11/56* (2006.01)
  *G11C 16/34* (2006.01)

(52) U.S. Cl.
  CPC ............... *G11C 16/10* (2013.01); *G11C 11/56* (2013.01); *G11C 16/3454* (2013.01); *G11C 16/3459* (2013.01)

(58) Field of Classification Search
  CPC .... G11C 16/10; G11C 11/56; G11C 16/3454; G11C 16/3459
  See application file for complete search history.

(56) References Cited

U.S. PATENT DOCUMENTS

| 6,888,758 | B1 | 5/2005 | Hemink et al. |
| 7,072,221 | B2 | 7/2006 | Wang |
| 7,177,199 | B2 | 2/2007 | Chen et al. |
| 7,317,636 | B2 * | 1/2008 | Ide et al. .................. 365/185.22 |

(Continued)

FOREIGN PATENT DOCUMENTS

| CN | 101174471 A | 5/2008 |
| CN | 101231888 A | 7/2008 |

(Continued)

OTHER PUBLICATIONS

Seung-Ho Chang et al., "A 48nm 32Gb 8-Level NAND Flash Memory with 5.5MB/s Program Throughput", ISSCC 2009, Session 13, Flash Memory, pp. 239-241 (2009).

*Primary Examiner* — Richard Elms
*Assistant Examiner* — Ajay Ojha
(74) *Attorney, Agent, or Firm* — Volentine & Whitt, PLLC

(57) ABSTRACT

A method of programming a flash memory device comprises programming selected memory cells, performing a verification operation to determine whether the selected memory cells have reached a target program state, and determining a start point of the verification operation based on a programming characteristic associated with a detection of a pass bit during programming of an initial program state.

17 Claims, 39 Drawing Sheets

(56) References Cited

U.S. PATENT DOCUMENTS

| | | |
|---|---|---|
| 7,369,629 B2 | 5/2008 | Umewaka |
| 2004/0109362 A1 | 6/2004 | Gongwer et al. |
| 2005/0157552 A1 | 7/2005 | Hemink et al. |
| 2006/0107136 A1 | 5/2006 | Gongwer et al. |
| 2007/0097747 A1 | 5/2007 | Li et al. |
| 2007/0097749 A1 | 5/2007 | Li et al. |
| 2008/0049487 A1 | 2/2008 | Yoshimura et al. |
| 2008/0056007 A1 | 3/2008 | Kang et al. |
| 2008/0106944 A1 | 5/2008 | Kim |
| 2008/0175064 A1 | 7/2008 | Wang |
| 2009/0003064 A1 | 1/2009 | Kim et al. |
| 2009/0016104 A1 | 1/2009 | Kim |
| 2009/0141560 A1 | 6/2009 | Park et al. |
| 2009/0310418 A1 | 12/2009 | Cernea |
| 2009/0310419 A1 | 12/2009 | Cernea |
| 2010/0061148 A1 | 3/2010 | Komatsu |

FOREIGN PATENT DOCUMENTS

| | | |
|---|---|---|
| JP | 2001273792 A | 10/2001 |
| JP | 2005327435 A | 11/2005 |
| JP | 2006509326 A | 3/2006 |
| JP | 2007519161 A | 7/2007 |
| JP | 2009514138 A | 4/2009 |
| JP | 2011524062 A | 8/2011 |
| KR | 1020050108979 A | 11/2005 |
| KR | 1020090005550 A | 1/2009 |
| TW | 200923949 A | 6/2009 |
| WO | WO2009151894 A1 | 12/2009 |

\* cited by examiner

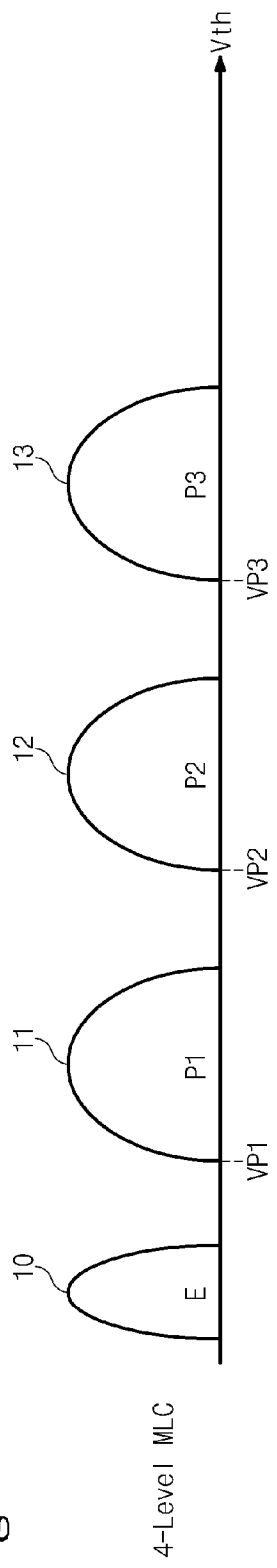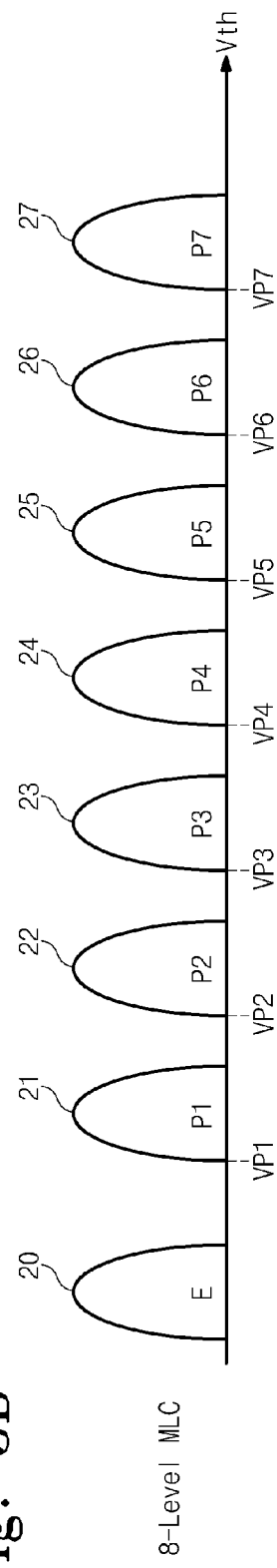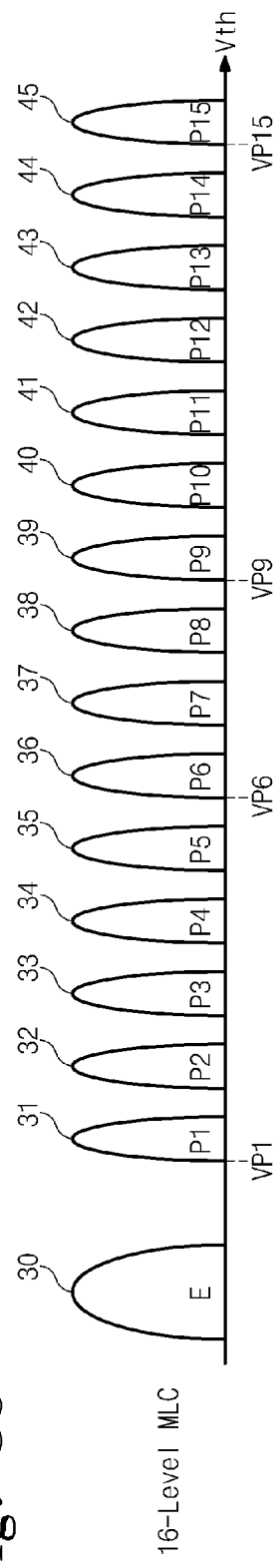

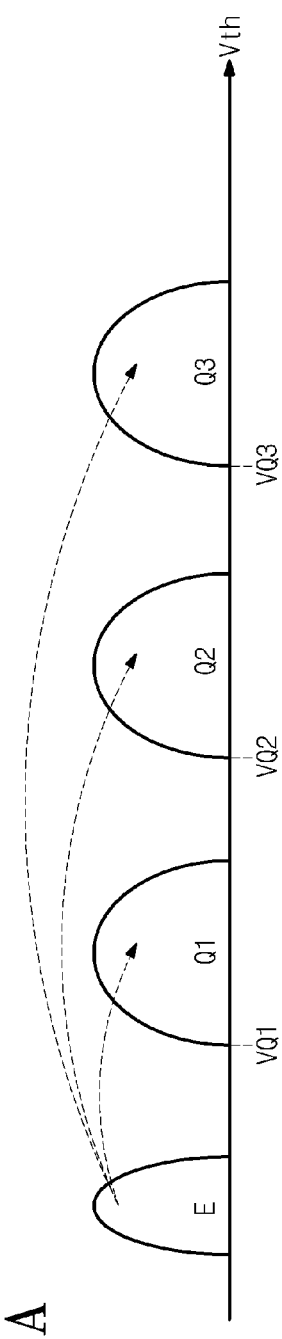
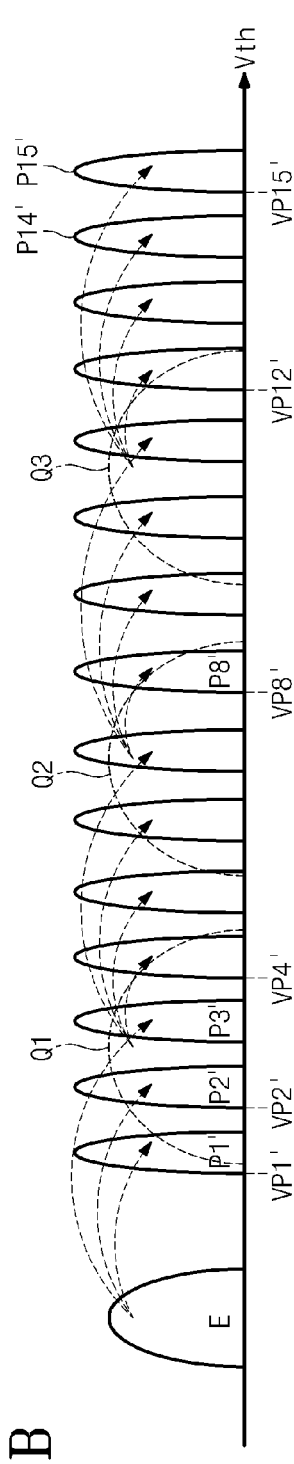
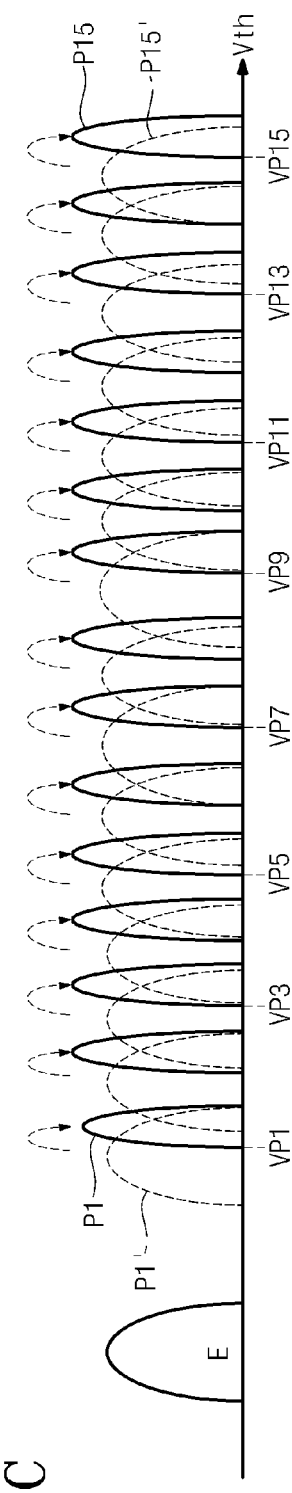
Fig. 5A
Fig. 5B
Fig. 5C

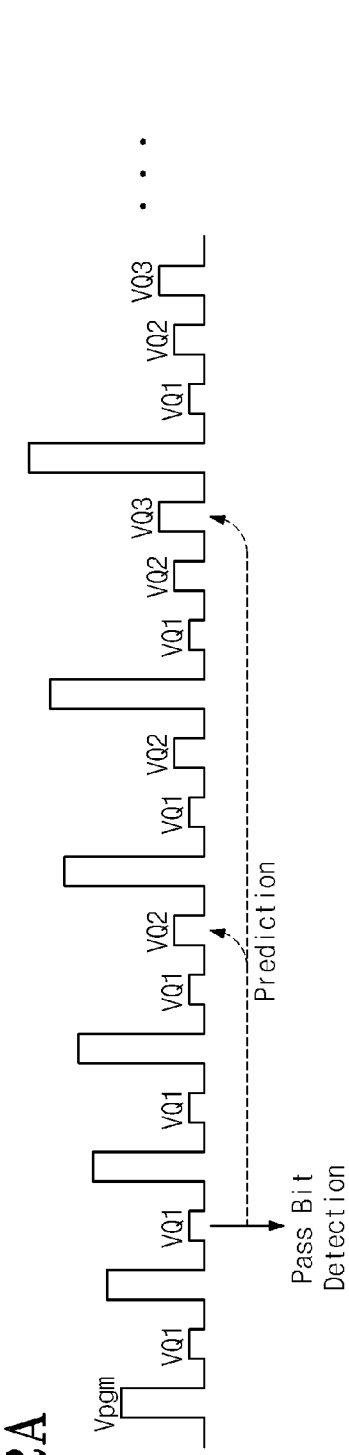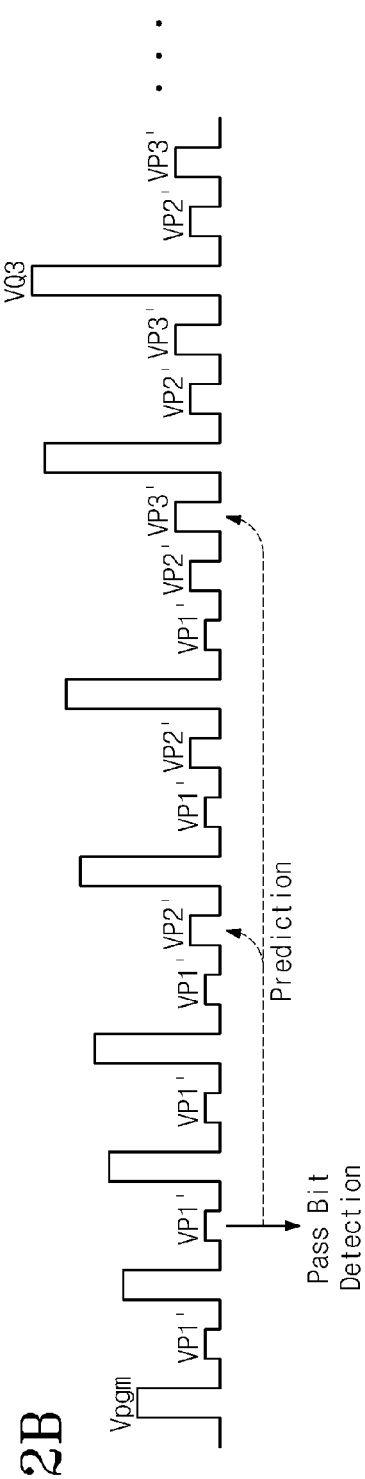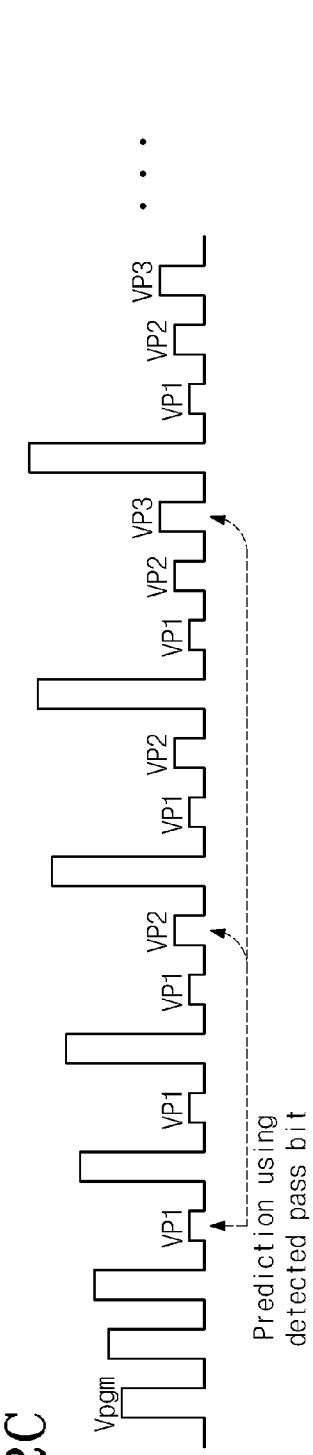

FLASH MEMORY DEVICE USING ADAPTIVE PROGRAM VERIFICATION SCHEME AND RELATED METHOD OF OPERATION

CROSS-REFERENCE TO RELATED APPLICATIONS

This is a continuation of U.S. non-provisional application Ser. No. 12/963,867, filed Dec. 9, 2010, which claims priority under 35 U.S.C. §119 to Korean Patent Application No. 10-2010-0012894 filed on Feb. 11, 2010, the disclosure of which is hereby incorporated by reference in its entirety.

BACKGROUND

Embodiments of the inventive concept relate generally to semiconductor memory devices. More particularly, embodiments of the inventive concept relate to flash memory devices using adaptive program verification schemes and related methods of operation.

Semiconductor memories play an important role in a wide variety of modern electronic devices, ranging from satellites to consumer products. Consequently, advances in semiconductor memory technology can lead to significant improvements in a broad range of technical applications.

Semiconductor memory devices can be roughly divided into two categories based on whether they retain stored data when disconnected from power. These categories include volatile semiconductor memory devices, which lose stored data when disconnected from power, and nonvolatile semiconductor memory devices, which retain stored data when disconnected from power. Examples of volatile memory devices include static random access memory (SRAM) devices and dynamic random access memory (DRAM) devices. Examples of nonvolatile memory devices include various types of read only memory (ROM), such as MROM, PROM, EPROM, and EEPROM.

Flash memory is a form of EEPROM that has achieved popularity in recent years. Flash memory tends to be relatively inexpensive and can provide high performance and data storage capacity compared with other forms of nonvolatile memory. In addition, flash memory is resistant to physical shock, making it especially popular for use in portable devices, such as cellular phones, digital cameras, netbook computers, and so on.

Flash memories have two common configurations, including a NOR configuration, and a NAND configuration. Flash memories having these configurations are referred to as NOR flash memories and NAND flash memories, respectively. NOR flash memories tend to provide faster access speed, but lower storage capacity, compared with NAND flash memories. Accordingly, NOR flash memories are often used to store information requiring fast access, such as code, while NAND flash memories are generally used to provide mass data storage capability for information such as multimedia information, data files, and so on.

Some flash memories are designed to store more than one bit of data per memory cell. Flash memories that store more than one bit of data per memory cell are referred to as multi-level cell (MLC) flash memories.

MLC flash memories are commonly programmed using a technique known as incremental step pulse programming (ISPP). In incremental step pulse programming, selected memory cells are programmed by a plurality of program loops, where each program loop comprises a programming execution section where program voltage is applied to a selected memory cell to modify its state, and a verification section where a verification voltage is applied to the selected memory cell to determine whether it has reached a target state. By performing program loops in this manner, selected memory cells are programmed gradually and can avoid certain types of programming errors such as over-programming.

SUMMARY

Embodiments of the inventive concept provide flash memory devices using adaptive program verification schemes, and methods of operating the flash memory devices.

According to one embodiment of the inventive concept, a method of programming a flash memory device comprises (a) programming selected memory cells, (b) performing a verification operation to determine whether threshold voltages of the selected memory cells have reached verification levels corresponding to target program states, (c) determining a verification start point for at least one of the target program states according to a parameter associated with a detection of an initial pass bit in the selected memory cells, and (d) determining a verification end point for at least one of the target program states according to a parameter associated with a detection of successful programming of multiple selected memory cells to a lowest one of the target program states.

In certain embodiments, the parameter associated with the detection of the initial pass bit is a program voltage used to program the selected memory cells in a program loop where the initial pass bit is detected.

In certain embodiments, the verification start point is a verification start loop.

In certain embodiments, the verification start point is varied according to a margin between a first threshold voltage distribution corresponding to an initial program state and a second threshold voltage distribution corresponding to the at least one target program state.

In certain embodiments, the verification start point is varied according to whether the first and second threshold voltage distributions overlap.

In certain embodiments, the verification start point is increased where the first and second threshold voltage distributions overlap.

In certain embodiments, the verification start point is decreased where the first and second threshold voltage distributions do not overlap.

In certain embodiments, the parameter associated with the detection of successful programming of multiple selected memory cells to the lowest one of the target program states comprises a program voltage used in a program loop where the multiple selected memory cells are detected to be successfully programmed to the lowest one of the target program states.

In certain embodiments, determining the verification end point comprises predicting a pass point for at least one of the target program states, and subtracting an offset value from the predicted pass point.

In certain embodiments, the same offset value is subtracted from predicted pass points of a plurality of the target program states to determine verification end points for the plurality of the target program states.

In certain embodiments, different offset values are subtracted from predicted pass points of a plurality of the target program states to determine verification end points for the plurality of the target program states.

According to an embodiment of the inventive concept, a method of programming a flash memory device comprises programming selected memory cells, performing a verification operation to determine whether threshold voltages of the selected memory cells have reached verification levels of target program states, and determining a verification start point to be used for each of the target program states in the verification operation according to a programming characteristic associated with an initial pass bit detected during programming of an initial program state in the selected memory cells.

In certain embodiments, each of the selected memory cells stores multi-level data.

In certain embodiments, programming the selected memory cells and performing the verification operation constitute a program loop, and the verification start point of each target program state is an iteration of the program loop in which the verification operation is first performed with respect to the target program state.

In certain embodiments, the programming characteristic associated with the initial pass bit is a programming voltage of a program loop in which the initial pass bit occurs.

In certain embodiments, the verification start points are varied according to a relationship between the target program states and the initial program state.

In certain embodiments, the relationship between the target program states and the initial program state is a margin between a first threshold voltage distribution corresponding to one of the target program states and a second threshold voltage distribution corresponding to the initial program state.

In certain embodiments, the verification start point of the one of the target program states is increased where the first and second threshold voltage distributions overlap.

In certain embodiments, the verification start point of the one of the target program states is decreased where the first and second threshold voltage distributions do not overlap.

In certain embodiments, information indicating the programming characteristic associated with the initial pass bit is provided to the flash memory device from an external source.

According to another embodiment of the inventive concept, a method is provided for determining verification start points for target program states of selected memory cells in a flash memory device. The method comprises detecting whether at least one of the selected memory cells has reached a lowest verification level among verification levels of the target program states, and variably determining verification start points of the target program states corresponding to remaining verification levels other than the lowest verification level according to a relationship between the target program states and initial states of the selected memory cells, according to a result of the detection.

In certain embodiments, the method further comprises storing the result of the detection.

In certain embodiments, the stored result of the detection is used to determine verification start points of final target program states in a reprogramming operation of each of the selected memory cells.

In certain embodiments, the verification start points of the target program states are varied by decreasing a verification start point of a target program state where the target program state has an overlapping threshold voltage distribution with an initial state.

In certain embodiments, the method further comprises providing the result of the detection to a device external to the flash memory device.

In certain embodiments, the result of the detection is used to determine verification start points for a subsequent programming operation of the selected memory cells.

According to one embodiment of the inventive concept, a flash memory device comprises a memory cell array comprising a plurality of memory cells connected to a plurality of word lines and bit lines, and a control logic controlling a programming operation of selected memory cells connected to a selected word line. The control logic determines whether threshold voltages of the selected memory cells are greater than or equal to verification levels of target program states during a verification operation, and determines a verification start point to be used for each of the target program states in the verification operation according to a programming characteristic associated with an initial pass bit detected during programming of an initial program state in the selected memory cells.

In certain embodiments, the control logic adjusts the verification start points of the verification operations associated with the target program states according to relationships between the target program states and corresponding initial states.

In certain embodiments, the verification start points of the target program states are varied by varied by decreasing a verification start point of a target program state where the target program state has an overlapping threshold voltage distribution with an initial state.

In certain embodiments, the programming characteristic is provided from a device external to the flash memory device.

According to another embodiment of the inventive concept, a method of programming a flash memory device comprises programming multi-bit data in selected memory cells of the flash memory device, and performing verification operations to determine whether the selected memory cells are programmed to target program states corresponding to the multi-bit data. Performing the verification operations comprises predicting a verification end point for an upper target program state among the target program states according to a pass point of a lower target program state among the target program states.

In certain embodiments, predicting the verification end point comprises predicting a pass point for the upper target program state according to the pass point of the lower target program state, and subtracting a predetermined offset value from the predicted pass point.

In certain embodiments, the predicted pass point corresponds to a particular programming loop or programming voltage.

In certain embodiments, the same offset value is used to predict verification end points for more than one of the target program states.

In certain embodiments, different offset values are used to predict verification end points for more than one of the target program states.

In certain embodiments, performing the verification operations further comprises sequentially performing the verification operations for each of the target program states other than the lower target program state.

In certain embodiments, verification operations are discontinued for the target program states other than the lower target program state upon reaching corresponding verification end points.

In certain embodiments, the lower target program state has a lowest threshold voltage distribution among the target program states.

In certain embodiments, target program states are divided into a plurality of groups, and verification end points of target program states in each group are predicted on the basis of a pass point of a lowest program state in the group.

In certain embodiments, verification end points are predicted for each group only after all of the target program states in lower groups are passed.

BRIEF DESCRIPTION OF THE DRAWINGS

The drawings illustrate selected embodiments of the inventive concept. In the drawings, like reference numbers indicate like features. In addition, the relative sizes of certain elements may be exaggerated for clarity.

FIGS. 3A through 3C are diagrams illustrating threshold voltage distributions of memory cells storing different numbers of bits.

FIGS. 5A through 5C are threshold voltage diagrams illustrating a method of programming a flash memory device according to an embodiment of the inventive concept.

FIGS. 12A through 12C are voltage diagrams showing program voltages and verification voltages for the methods of FIGS. 5A through 5C.

DETAILED DESCRIPTION OF EMBODIMENTS

Embodiments of the inventive concept are described below with reference to the accompanying drawings. These embodiments are presented as teaching examples and should not be construed to limit the scope of the inventive concept.

In the description that follows, where a first feature is referred to as being "connected" to a second feature, the first feature can be either "directly connected" to the second feature, or "electrically connected" to the second feature via an intervening feature. Terms in singular form encompass plural forms unless the context indicates otherwise. The terms "include," "comprise," "including," or "comprising," specify the presence of a feature, but do not exclude other features.

Figure 1:
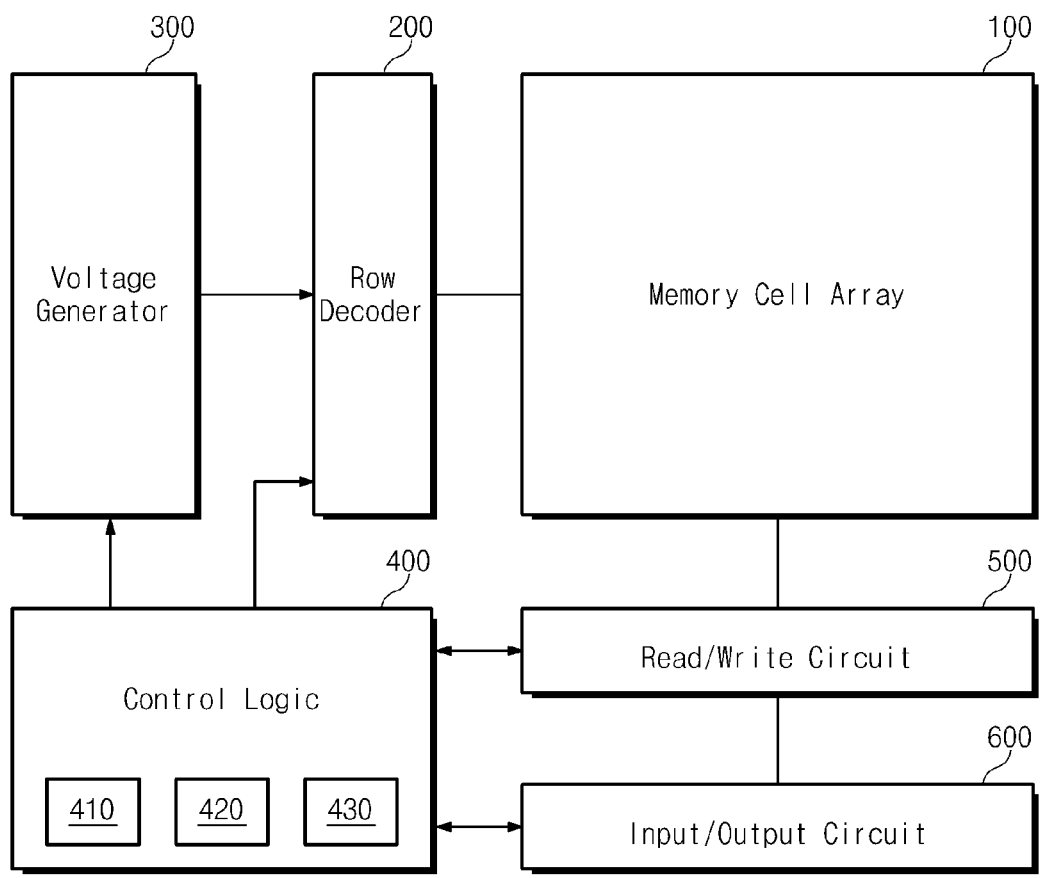
FIG. 1 is a block diagram illustrating a flash memory device according to an embodiment of the inventive concept.

FIG. 1 is a block diagram illustrating a flash memory device according to an embodiment of the inventive concept. For explanation purposes, it will be assumed that the flash memory device of FIG. 1 is a NAND flash memory device. However, embodiments of the inventive concept are not limited to NAND flash memory devices.

Referring to FIG. 1, the flash memory device comprises a memory cell array 100 comprising memory cells arranged in rows connected to wordlines WL and columns connected to bitlines BL. Each memory cell stores 1-bit data or M-bit data, where M is an integer greater than one. Each memory cell can store information using a charge storage layer such as a floating gate or a charge trapping layer, a variable resistor, or another type of memory element.

Memory cell array 100 can be implemented with a single-layer array structure (called a two-dimensional array structure) or a multi-layer array structure (called a three-dimensional array structure). Examples of a three-dimensional array structure are disclosed in U.S. Patent Publication No. 2008/0023747 entitled "SEMICONDUCTOR MEMORY DEVICE WITH MEMORY CELLS ON MULTIPLE LAYERS" and U.S. Patent Publication No. 2008/0084729 entitled "SEMICONDUCTOR DEVICE WITH THREE-DIMENSIONAL ARRAY STRUCTURE", the respective disclosures of which are hereby incorporated by reference.

A row decoder 200 performs selection and driving operations for the rows of memory cell array 100. A voltage generator 300 is controlled by a control logic 400 and generates voltages (for example, a program voltage, a pass voltage, an erase voltage, and a read voltage) for program, erase, and read operations. A read/write circuit 500 is controlled by control logic 400 and operates as a sense amplifier or a write driver according to various operation modes of the flash memory device. For example, in a read operation, read/write circuit 500 operates as a sense amplifier for sensing data from selected memory cells of a selected row. An input/output circuit 600 receives read data from read/write circuit 500 and transmits the read data to an external destination. In a programming operation, read/write circuit 500 operates as a write driver to drive selected memory cells of a selected row according to program data. Read/write circuit 500 comprises page buffers that correspond to respective bitlines or bitline pairs. Where the selected memory cells store multi-bit/multi-level data, each page buffer of read/write circuit 500 may include two or more latches. Input/output circuit 600 typically interfaces with an external device, such as a memory controller or a host.

Control logic 400 controls the overall operation of the flash memory device and comprises a pass bit detector 410, a pass/fail determiner 420, and a register 430.

Pass bit detector 410 receives data that has been read by read/write circuit 500 in a verification operation. Pass bit detector 410 then determines whether a threshold voltage of at least one of the selected memory cells is greater than or equal to a verification level of a first program state (i.e., whether the at least one selected memory cell is "program passed" with respect to the first program state), based on the data read by read/write circuit 500. Where at least one of the selected memory cells is determined to be program passed with respect to the first program state, control logic 400 determines verification start points for performing verification operations with respect to further program states.

A verification start point is a point of a program operation, such as a specific program loop, where a verification operation is first performed for a particular program state. For instance, a verification start point for a program state P2 of selected memory cells can be a first program loop in which a verification operation is performed to determine whether the selected memory cells are successfully programmed to state P2. In program loops that precede the verification start point for program state P2, verification operations for program state P2 are omitted.

In certain embodiments, the verification start point for a program state P2 is determined according to a saved value of a program voltage at which a first selected memory cell is detected to be successfully programmed to program state P1. For instance, in some embodiments, the verification start point is a program loop where the value of the program voltage equals a sum of the saved value and a predetermined value.

Register 430 stores pass bit information from control logic 400 to indicate a program-passed loop. The program-passed loop is a program loop where at least one selected memory cell is program passed with respect to a particular program state. The pass bit information determines the start points of verification operations for subsequent program states, as will be described below. The pass bit information can also be provided to an external device, such as a memory controller. Pass/fail determiner 420 determines whether all the selected memory cells are successfully programmed on the basis of read data provided from read/write circuit 500 during the verification operation.

In other words, pass/fail determination determines whether all of the selected memory cells to be programmed to a particular program state have reached that state. Meanwhile, pass bit detection detects whether at least one of the selected memory cell to be programmed to the particular program state have reached that state. The order of pass/fail determination and pass bit detection can be changed in various alternative embodiments. For example, in some embodiments, pass bit detection is performed before pass/fail determination, and in other embodiments, pass bit detection is performed after pass/fail determination.

Figure 2:
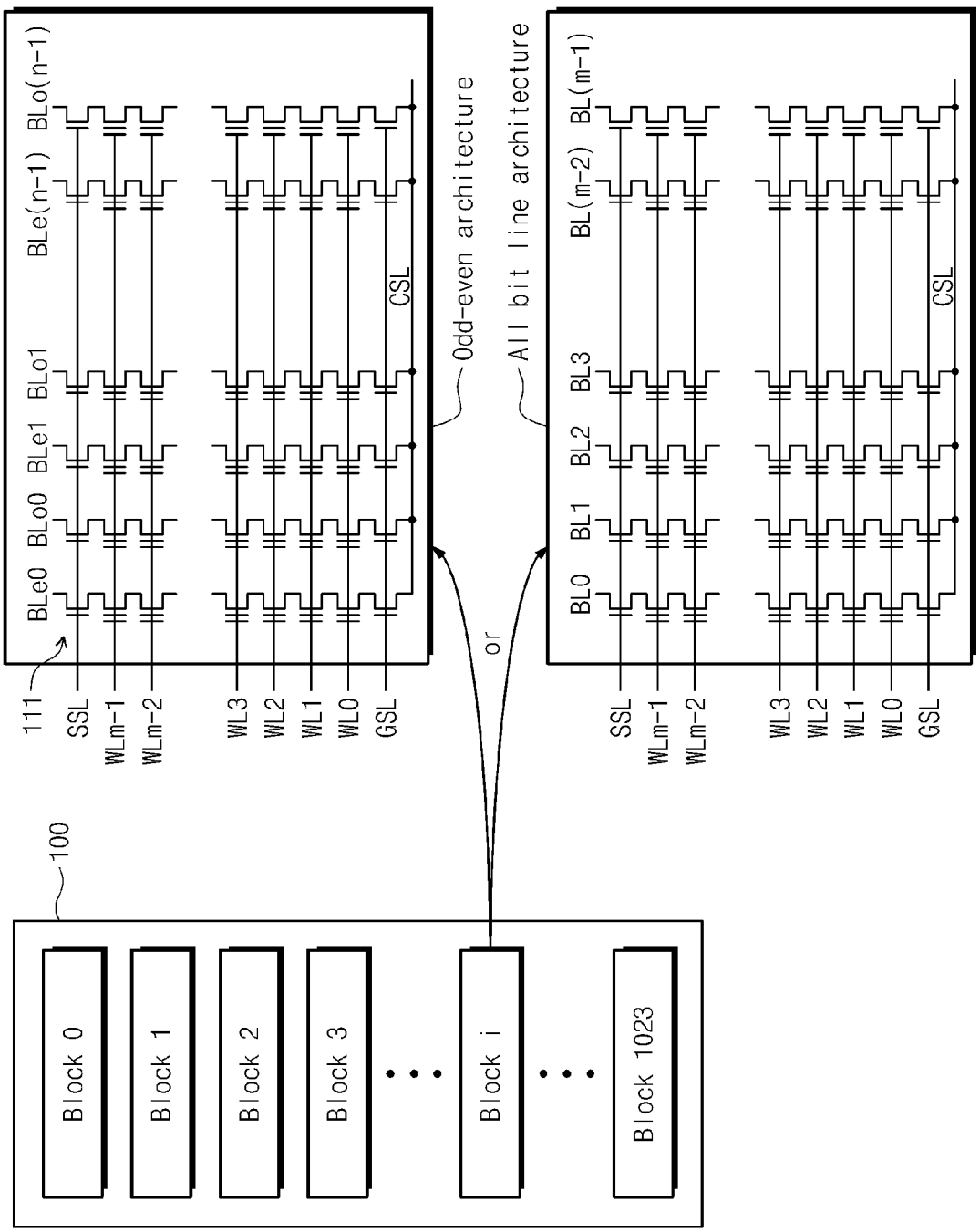
FIG. 2 is a diagram illustrating a flash memory device comprising a memory cell array with memory blocks having an all bitline architecture or an odd-even bitline architecture.

FIG. 2 is a diagram illustrating a flash memory device comprising a memory cell array with memory blocks having an all bitline architecture or an odd-even bitline architecture. In the example of FIG. 2, a NAND flash memory device comprises memory cell array 100 having 1024 memory blocks. In memory cell array 100, data stored in the same memory block is erased simultaneously. In each memory block, memory cells are arranged in columns connected to the same bitline (e.g., 1 KB bitlines).

In the all bitline architecture, all bitlines of a memory block are simultaneously selected during read and programming operations. Accordingly, memory cells connected to a common wordline and connected to all the bitlines are simultaneously programmed. In the example of FIG. 2, memory cells in the same column are serially connected to form NAND string 111. One end of NAND string 111 is connected to a corresponding bitline through a selection transistor controlled by a string selection line SSL, and another end is connected to a common source line CSL through a selection transistor controlled by a ground selection line GSL.

In the odd-even architecture, bitlines are divided into even bitlines BLe and odd bitlines BLo. Memory cells connected to a common wordline and connected to odd bitlines are programmed together, while memory cells connected to the common wordline and connected to even bitlines are programmed together. Data can be programmed in different memory blocks and read from different memory blocks. These operations can be performed at the same time.

FIGS. 3A through 3C are diagrams illustrating threshold voltage distributions for memory cells storing different numbers of bits. In particular, FIG. 3A shows threshold voltage distributions for memory cells storing 2-bit data, FIG. 3B shows threshold voltage distributions for memory cells storing 3-bit data, and FIG. 3C shows threshold voltage distributions for memory cells storing 4-bit data. The threshold voltage distributions of FIGS. 3A through 3C correspond to program states of memory cells. Accordingly, the threshold voltage distributions will at times be referred to as program states in the description that follows.

Where 2-bit data (4-level data or 2-page data) is stored in a group of memory cells, as shown in FIG. 3A, each of the memory cells has a threshold voltage within one of four threshold voltage distributions 10 through 13. Threshold voltage distribution 10 encompasses threshold voltages of erased memory cells, and threshold voltage distributions 11 through 13 encompass threshold voltages of programmed memory cells. Voltages VP1 through VP3 are verification voltages for determining whether memory cells are programmed into respective threshold voltage distributions 11 through 13.

Where 3-bit data (8-level data or 3-page data) is stored in a group of memory cells, as shown in FIG. 3B, each of the memory cells has a threshold voltage within one of eight threshold voltage distributions 20 through 27. Threshold voltage distribution 20 comprises threshold voltages of erased memory cells, and threshold voltage distributions 21 through 27 comprise threshold voltages of programmed memory cells. Voltages VP1 through VP7 are verification voltages for determining whether memory cells are respectively programmed into threshold voltage distributions 21 through 27.

Where 4-bit data (16-level data or 4-page data) is stored in a group of memory cells, as shown in FIG. 3C, each of the memory cells has a threshold voltage within one of sixteen threshold voltage distributions 30 through 45. Threshold voltage distribution 30 comprises threshold voltages of erased memory cells, and threshold voltage distributions 31 through 45 comprise threshold voltages of programmed memory cells. Voltages VP1 through VP15 are verification voltages for determining whether selected memory cells are programmed into threshold voltage distributions 31 through 45.

Figure 4:
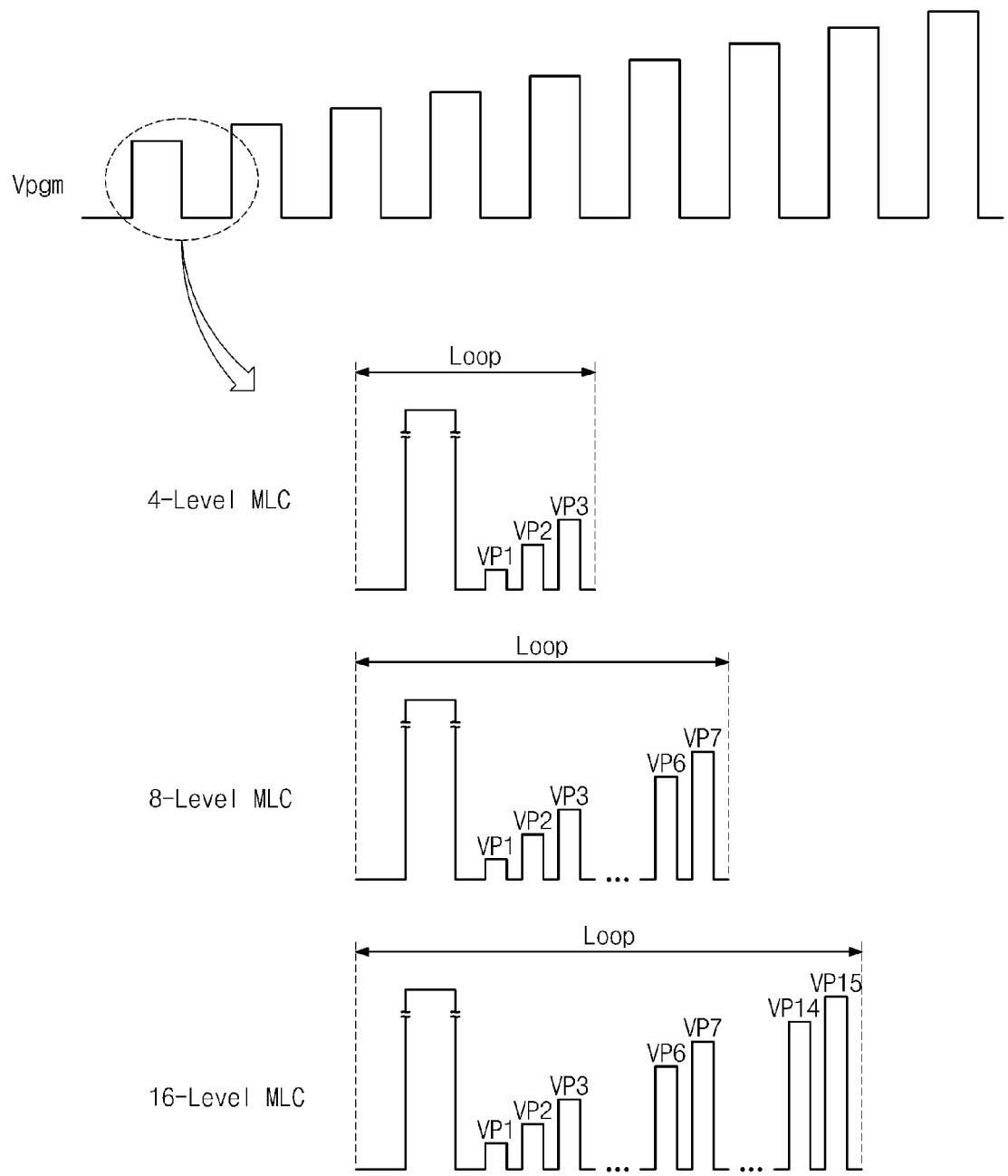
FIG. 4 is a diagram illustrating a series of programming pulses used to program memory cells connected to a selected wordline.

FIG. 4 is a diagram illustrating a series of programming pulses used to program selected memory cells connected to a selected wordline. The example of FIG. 4 uses a general ISPP scheme. Certain embodiments of the inventive concept use a programming scheme that is modified relative to the general ISPP scheme of FIG. 4.

In the general ISPP scheme, a program voltage Vpgm is applied to control gates of selected memory cells as a series of programming pulses. The level of the programming pulses increases in successive iterations.

In periods between programming pulses, verification operations (or verification read operations) are performed. The verification operations determine whether the threshold voltages of selected memory cells have reached a verification level.

In an array of multi-level flash memory cells such as those described with respect to FIG. 3, a verification operation is performed to determine whether a selected memory cell has reached a threshold voltage distribution corresponding to a desired logic state. For instance, as illustrated in FIG. 4, in a 4-level MLC, verification operations are performed using verification voltages VP1 through VP3 to determine whether a selected memory cell has been successfully programmed to a logic state corresponding to one of threshold voltage distributions 11 through 13. Similarly, in an 8-level MLC, verification operations are performed using verification voltages VP1 through VP7, and in a 16-level MLC, verification operations are performed using fifteen verification voltages VP1 through VP15.

The time required to perform programming operations using the general programming scheme of FIG. 4 tends to increase in proportion to the number of program states of the selected memory cells. Moreover, in these programming operations, verification operations tend to occupy a large portion of the total programming time. Accordingly, a flash memory device according to certain embodiments of the inventive concept applies an adaptive verification scheme that reduces the verification time even where the number of program states of the selected memory cells is relatively large.

FIGS. 5A through 5C are diagrams illustrating a method of programming a flash memory device according to an embodiment of the inventive concept. In the embodiment of FIGS. 5A through 5C, it is assumed that a flash memory device stores 4-bit data in each cell and performs a programming operation according to a 3-step programming scheme.

In the method of FIGS. 5A through 5C, first and second page data is simultaneously programmed in selected memory cells connected to a selected wordline. As illustrated in FIG. 5A, selected memory cells having threshold voltage distributions corresponding to an erased state E are programmed to threshold voltage distributions corresponding to program states Q1 through Q3 according to data to be programmed.

Next, third and fourth page data is simultaneously stored in the selected memory cells. As illustrated in FIG. 5B, selected memory cells in erased state E are programmed to threshold voltage distributions corresponding to program states P1' through P3' according to data to be programmed Selected memory cells in program state Q1 of FIG. 5A are programmed to threshold voltage distributions corresponding to program states P4' through P7' according to data to be programmed Selected memory cells in program state Q2 of FIG. 5A are programmed to threshold voltage distributions corresponding to program states P8' through P11' according to data to be programmed Selected memory cells in program state Q3 of FIG. 5A are programmed to threshold voltage distributions corresponding to program states P12' through P15' according to data to be programmed.

Verification voltages VP1' through VP15', which are used to determine program states P1' through P15', are lower than verification voltages VP 1 through VP 15, which are used to determine final program states P1 through P15 (see FIG. 5C). For example, a verification voltage VP 1', which is used to determine a program state P1', is lower than a verification voltage VP1, which is used to determine a corresponding final threshold voltage distribution P1 (see FIG. 5C). An operation that programs selected memory cells to the threshold voltage distributions of FIG. 5B, is referred to as a coarse programming operation.

Selected memory cells in program states P1' through P15' are programmed to have final program states P1 through P15 in a fine programming operation (or a reprogramming operation).

The programming operations of FIGS. 5A through 5C can be successively or non-successively performed. These programming operations can have verification operations for determining whether selected memory cells are programmed to target threshold voltage distributions.

Figure 6:
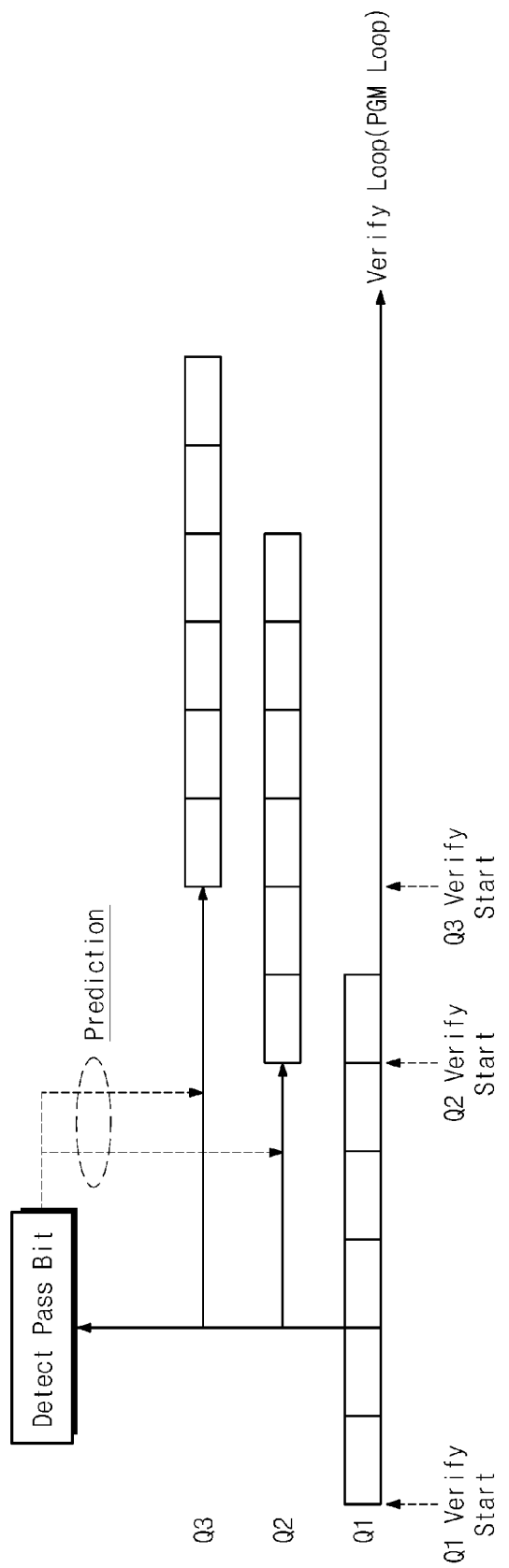
FIGS. 6 and 7 are diagrams illustrating a method of verifying a programming operation of FIG. 5A.
Figure 7:
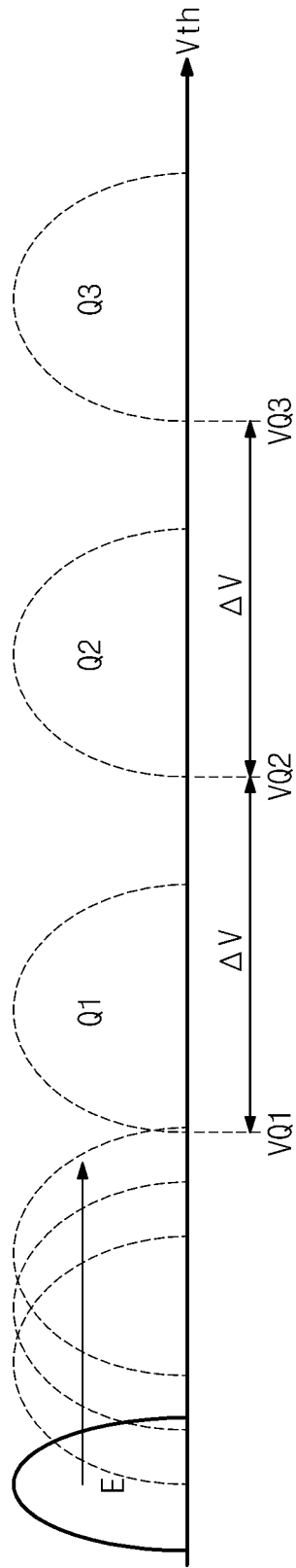

FIGS. 6 and 7 are diagrams illustrating a method of verifying the programming operation of FIG. 5A.

Referring to FIG. 6, after a program voltage Vpgm is applied to selected memory cells connected to a selected wordline, a verification voltage for verifying a program state Q1 is applied to the selected wordline. At this point, as illustrated in FIG. 6, verification operations for other program states Q2 and Q3 are not performed. A verification voltage is then applied to the selected wordline, and read/write circuit 500 reads data from the memory cells. Subsequently, pass bit detector 410 of control logic 400 detects whether a threshold voltage of at least one selected memory cell is greater than or equal to a verification voltage VQ1 of program state Q1 on the basis of read data. Where no selected memory cell has a threshold voltage greater than or equal to verification voltage VQ1, program voltage Vpgm increases by a predetermined amount and the programming operation proceeds to a next program loop. Otherwise, the flash memory device determines verification start points for program states Q2 and Q3.

Referring to FIG. 7, where at least one selected memory cell is detected to have a threshold voltage greater than or equal to verification voltage VQ1, control logic 400 sets a verification start point of program state Q2 according to a present value of program voltage Vpgm. In particular, control logic 400 sets the verification start point as a program loop having a value of program voltage Vpgm equal to a sum of the present value of program voltage Vpgm and a voltage difference $\Delta V$ between verification voltages VQ1 and VQ2. In addition, assuming that a voltage difference between verification voltages VQ2 and VQ3 is also $\Delta V$, control logic 400 sets a verification start point of program state Q3 as a program loop having a value of program voltage Vpgm equal to the sum of the present value of program voltage Vpgm and 2ΔV. As illustrated in FIG. 6, verification operations of program states Q2 and Q3 are not performed until the determined verification start point.

In some embodiments, a program loop where a pass bit is detected (or a program voltage applied to selected memory cell(s) determined as a pass bit) is stored in register 430 of control logic 400. Alternatively, the program loop (or program voltage) is provided to an external device, such as a memory controller, under the control of control logic 400.

As indicated above, pass/fail determination can be performed by pass/fail determiner 420 before or after pass bit detection is performed. Where a selected memory cell is successfully programmed to its target state, a program-inhibition voltage is applied to the selected memory cell in subsequent program loops.

Figure 8:
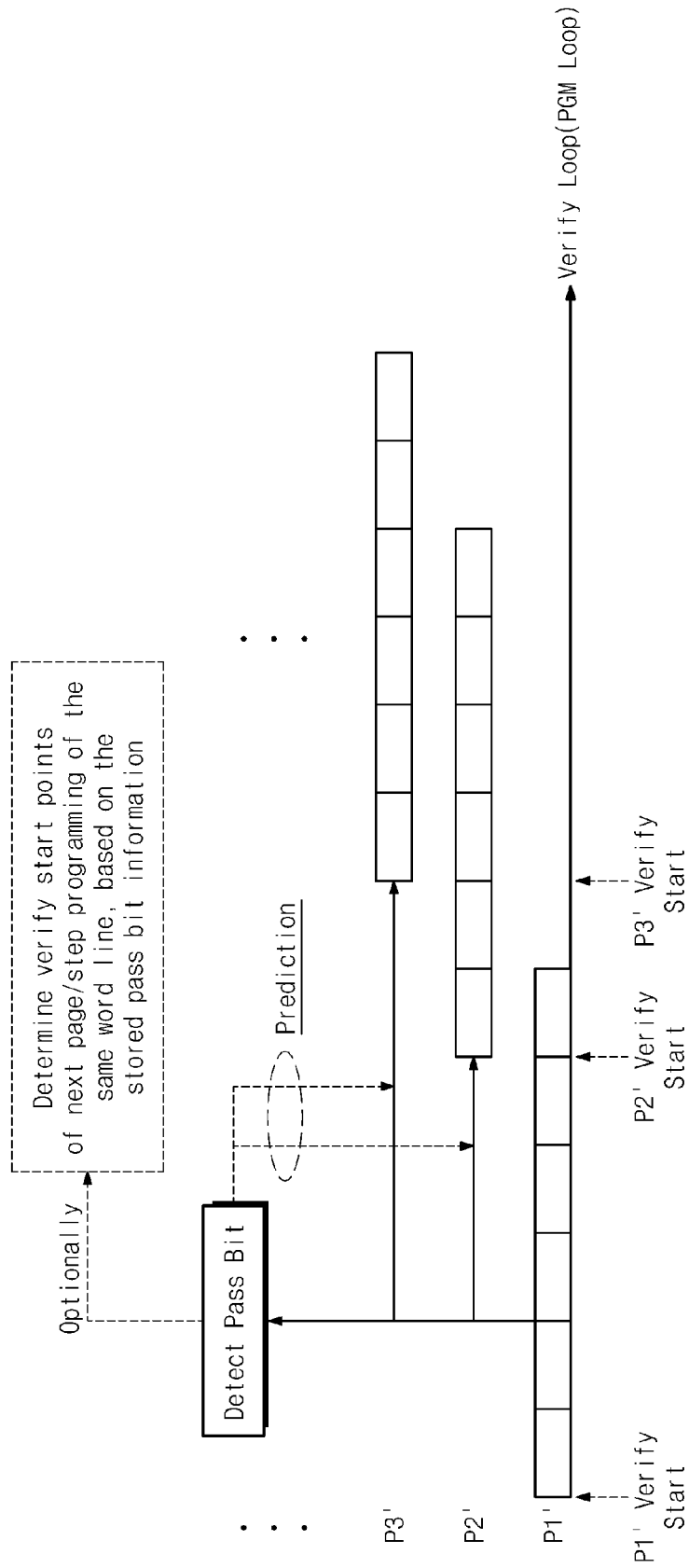
FIGS. 8 and 9 are diagrams illustrating a method of verifying a programming operation of FIG. 5B.
Figure 9:
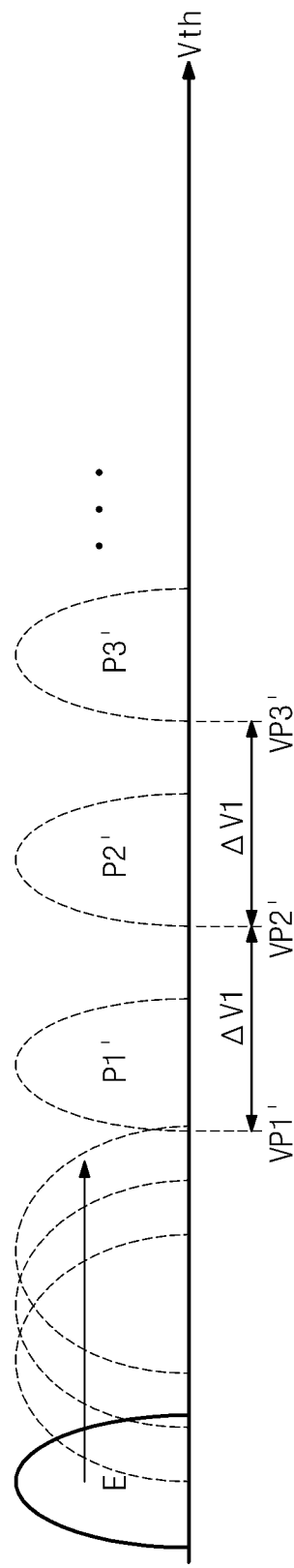

FIGS. 8 and 9 are diagrams illustrating a method of verifying a programming operation of FIG. 5B.

Referring to FIG. 8, after program voltage Vpgm is applied to selected memory cells connected to a selected wordline, a verification voltage for verifying program state P1' is applied to the selected wordline. At this point, as illustrated in FIG. 8, verification operations for other program states P2' through P15' are not performed. A verification voltage is then applied to the selected wordline, and read/write circuit 500 reads data from the selected memory cells. Subsequently, pass bit detector 410 of control logic 400 detects whether a threshold voltage of at least one selected memory cell is greater than or equal to verification voltage VP1' of program state P1' on the basis of the read data. Where no selected memory cell has a threshold voltage greater than or equal to verification voltage VP1' of program state P1', program voltage Vpgm is increased by a predetermined amount, and the programming operation proceeds to a next program loop. Otherwise, the flash memory device determines verification start points for program states P2' through P15'.

Referring to FIG. 9, where at least one selected memory cell is detected to have a threshold voltage greater than or equal to verification voltage VP 1', control logic 400 sets a verification start point of program state P2' according to a present value of program voltage Vpgm. In particular, control logic 400 sets the verification start point as a program loop having a value of program voltage Vpgm equal to a sum of the present value of program voltage Vpgm and a voltage difference ΔV1 between verification voltages VP1' and VP2'. In addition, assuming that a voltage difference between verification voltages VP2' and VP3' is also ΔV1, control logic 400 sets a verification start point of program state P3' as a program loop having a value of program voltage Vpgm equal to the sum of the present value of program voltage Vpgm and 2ΔV1. As illustrated in FIG. 8, verification operations of program states P2' through P15' are not performed until corresponding verification start points.

In some embodiments, register 430 of control logic 400 stores pass bit information, such as a program loop where a pass bit is detected, or a program voltage of the loop, during a coarse programming operation. The pass bit information stored in register 430 can then be used to determine verification start points of final program states P1 through P15 for a fine programming operation.

In some embodiments, pass bit information is output to an external device, such as a memory controller. The pass bit information can be used to perform a fine programming operation for selected memory cells.

Figure 10:
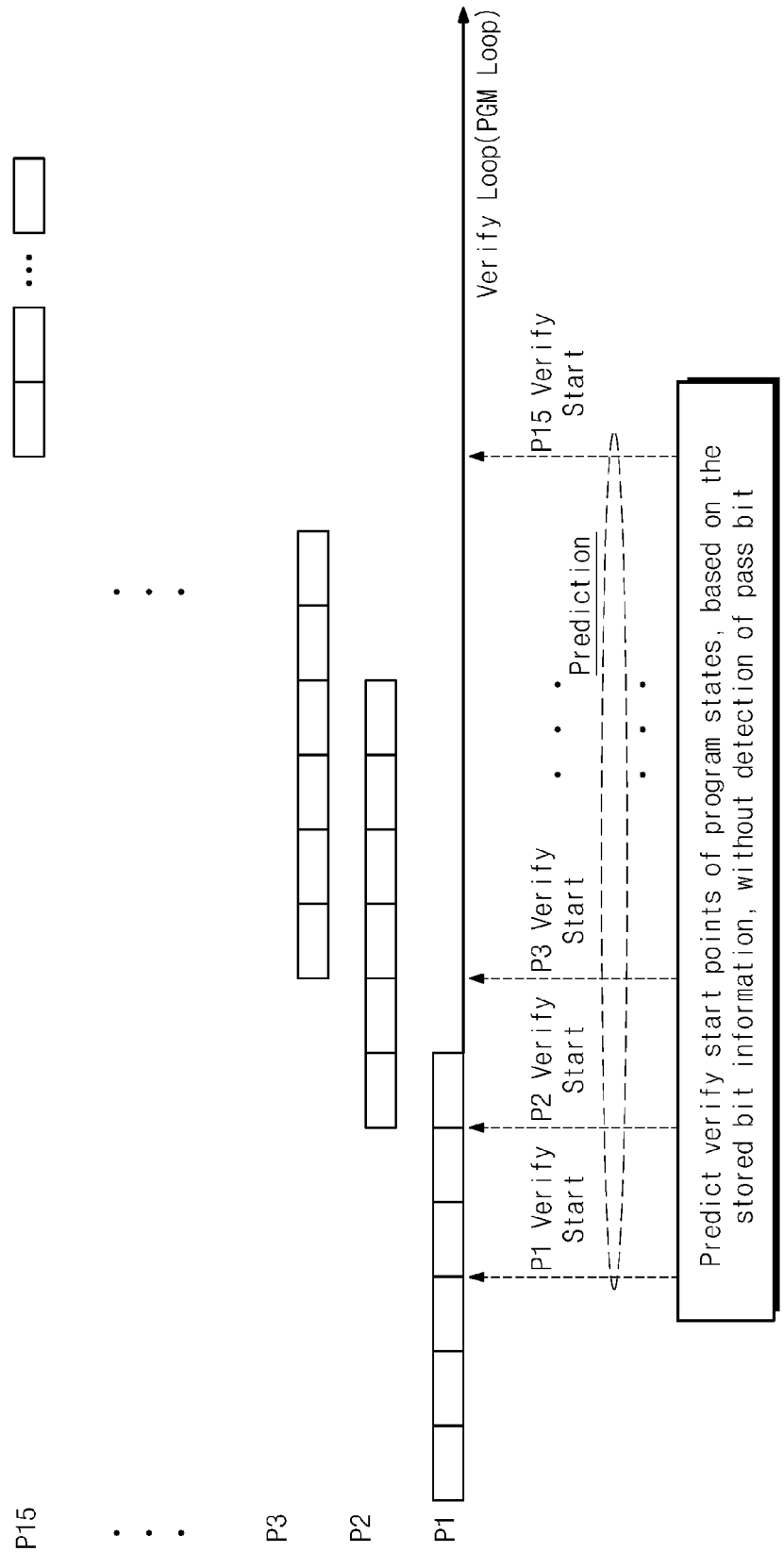
FIGS. 10 and 11 are diagrams illustrating a method of verifying a programming operation of FIG. 5C.
Figure 11:
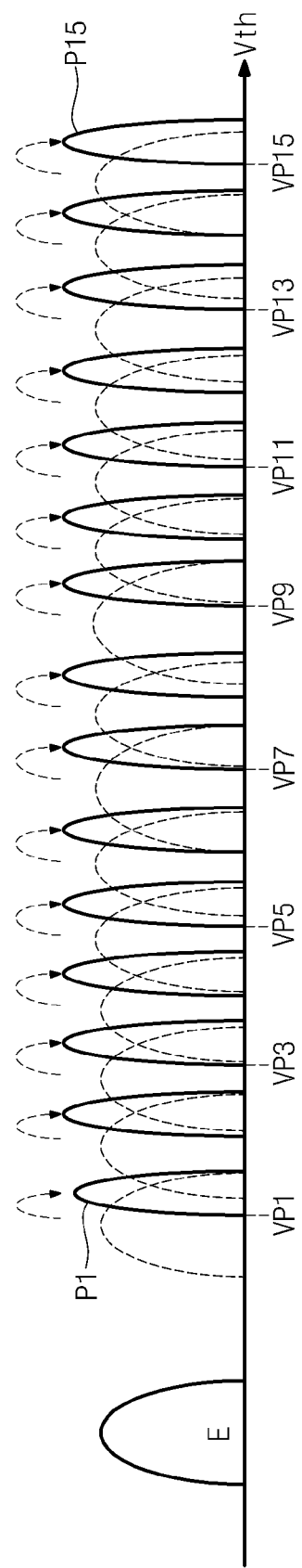

FIGS. 10 and 11 are diagrams illustrating a method of verifying the programming operation of FIG. 5C.

Referring to FIG. 10, control logic 400 determines verification start points of program states P1 through P15 based on pass bit information detected in a previous programming operation. The pass bit information can be accessed, for instance, from register 430. Referring to FIG. 11, control logic 400 determines the verification start point of program state P1 on the basis of pass bit information indicating a pass bit detected in a previous page programming operation of a selected wordline. Control logic 400 determines the verification start point of program state P2 as a program loop where program voltage Vpgm equals a sum of a voltage difference ΔV2 between verification voltages VP1 and VP2, and a program voltage Vpgm corresponding to the pass bit information detected in the previous programming operation. In addition, assuming that a voltage difference between verification voltages VP2 and VP3 is also ΔV2, control logic 400 sets a verification start point of program state Q3 as a program loop having a value of program voltage Vpgm equal to the sum of the present value of program voltage Vpgm and 2ΔV2. As illustrated in FIG. 10, verification operations of program states P2 through P15 are not performed until the corresponding verification start points.

In the programming method described above with reference to FIG. 5, the verification operations for program states P1 through P15 are not performed until corresponding verification start points. For example, verification voltages for verifying program states P1 through P15 are applied to selected wordlines only after a current loop reaches a verification start point for the corresponding program state.

FIG. 12A is a voltage diagram showing program voltages and verification voltages for the method of FIG. 5A. FIG. 12B is a voltage diagram showing program voltages and verification voltages for the method of FIG. 5B. FIG. 12C is a voltage diagram showing program voltages and verification voltages for the method of FIG. 5C.

As illustrated in FIG. 12A, a pass bit is detected during a verification operation of program state Q1. Once the pass bit is detected, verification start points of other program states Q2 and Q3 are determined by control logic 400. As illustrated in FIG. 12B, a pass bit is detected during a verification operation of program state P1'. Once the pass bit is detected, verification start points of other program states P2' and P15' are determined by control logic 400. At this point, pass bit information is stored in register 430 of control logic 400 to determine verification start points of subsequent page programming operations, such as fine programming stages. Finally, as illustrated in FIG. 12C, verification start points of final program states P1 through P15 are determined on the basis of information stored in register 430.

In the programming operations described with reference to FIGS. 5 through 12, programming speed is increased by eliminating certain verification operations.

Figure 13:
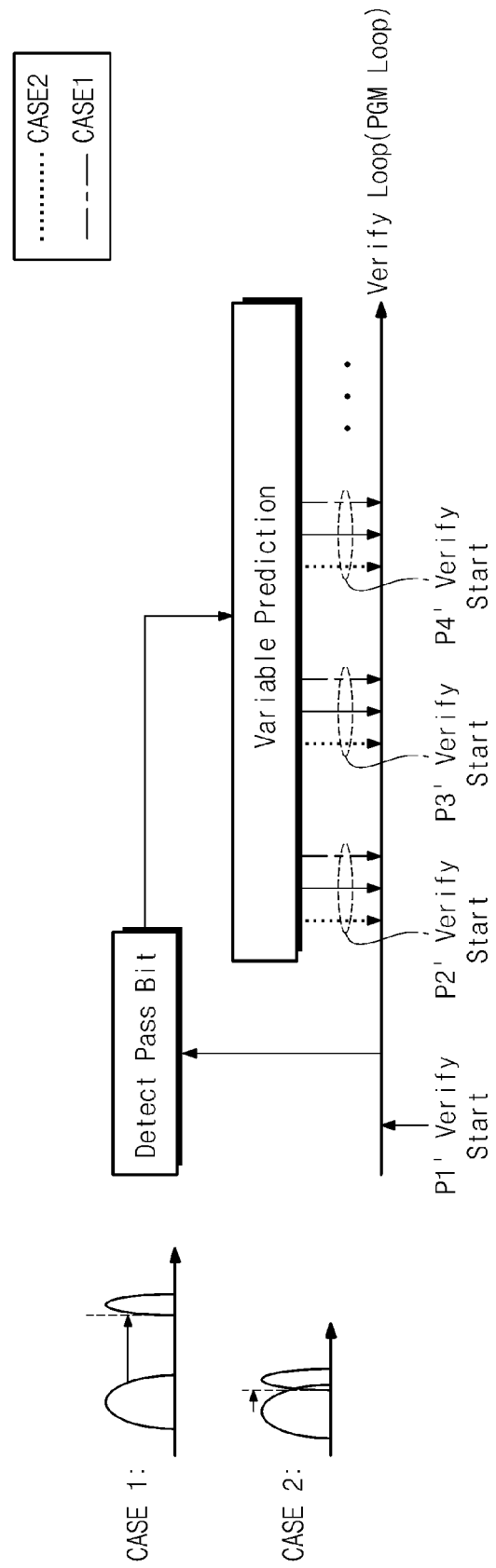
FIG. 13 is a diagram illustrating a method of programming a flash memory device according to another embodiment of the inventive concept.

FIG. 13 is a diagram illustrating a method of programming a flash memory device according to another embodiment of the inventive concept. In the method of FIG. 13, memory cells are programmed using different techniques according to different cases shown on the left side of FIG. 13.

In the two different cases of FIG. 13, verification start points of program states are variably set according to previous states and target states of selected memory cells. In a first case, the previous state and the target state do not overlap because the threshold voltage distribution of the previous state does not exceed the verification voltage of the target state. In a second case, the previous state and the target state overlap because the threshold voltage distribution of the previous state exceeds the verification voltage of the target state.

Where a target state to be verified corresponds to the first case, the verification start point of the target state uses a verification voltage illustrated by a dashed line to the right of a solid line in FIG. 13. On the other hand, where a target state to be verified corresponds to the second case, the verification start point of the target state uses a verification voltage illustrated as a dotted line to the left of the solid line in FIG. 13. In the example of FIG. 13, the verification start point corresponding to the solid line is determined according to the method of FIG. 6 or FIG. 8.

Applying the method of FIG. 13 to the example of FIG. 5A, the first case can be realized by previous state E and target states Q1 through Q3. In the example of FIG. 5A, the second case does not arise because memory cells are not programmed between threshold voltage distributions that overlap each other. Applying the method of FIG. 13 to the example of FIG. 5B, the first case can be realized by previous state E and target states P r through P3', a previous state Q1 and target states P5' through P7', a previous state Q2 and target states P9' through P11', and a previous state Q3 and target states P13' through P15'. The second case can be realized by a previous state Q1 and a target state P4', a previous state Q2 and a target state P8, and a previous state Q3 and a target state P12. Applying the method of FIG. 13 to the example of FIG. 5C, the second case can be realized by previous states P1' through P15' and target states P1 through P15.

Figure 14:
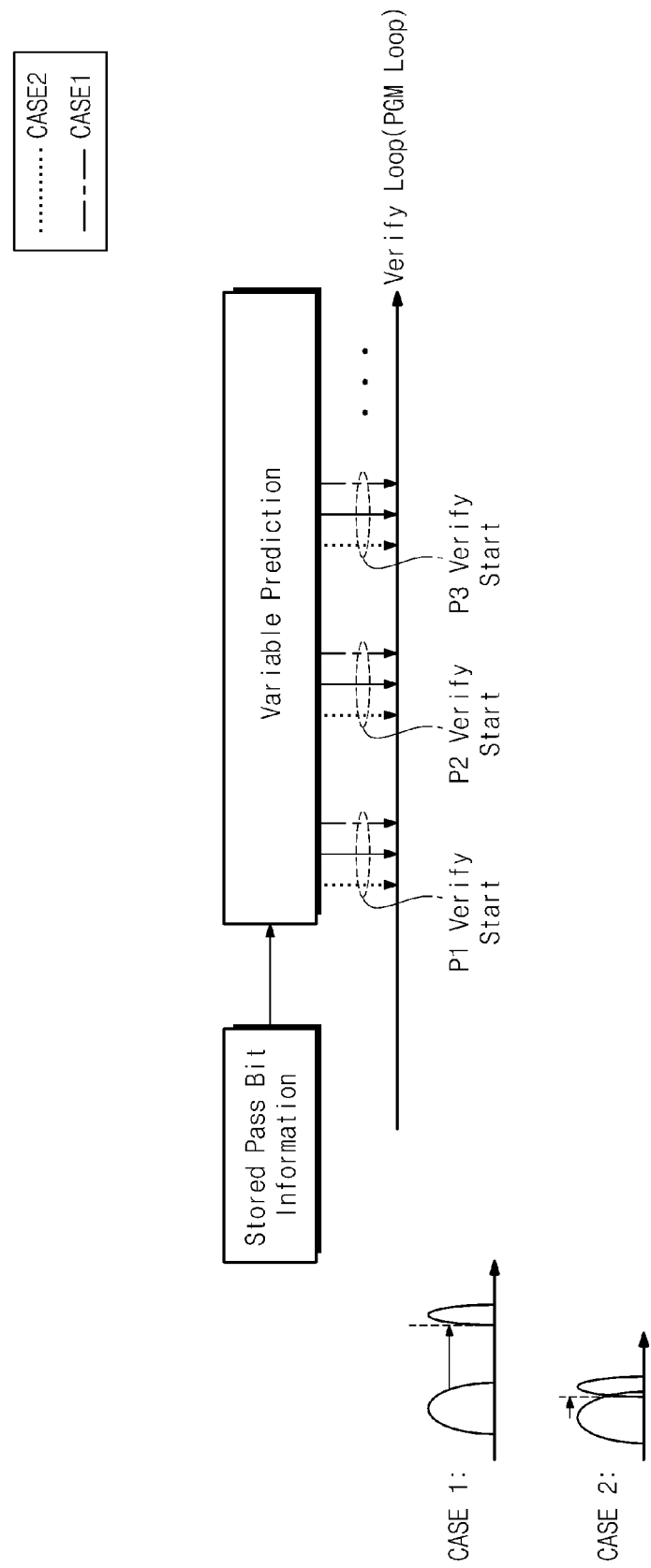
FIG. 14 is a diagram illustrating a method of programming a flash memory device according to another embodiment of the inventive concept.

FIG. 14 is a diagram illustrating a method of programming a flash memory device according to another embodiment of the inventive concept.

The method of FIG. 14 is substantially the same as the method of FIG. 13, except that the determination of verification start points is performed on the basis of pass bit information from a previous page programming operation of the same wordline instead of pass bit detection for first programming state P 1.

As indicated in the above descriptions of FIGS. 13 and 14, the verification start point of each program state is determined on the basis of a detected pass bit, a stored pass bit, or a relationship between the detected pass bit or the stored pass bit and a previous state and a target state.

Figure 15:
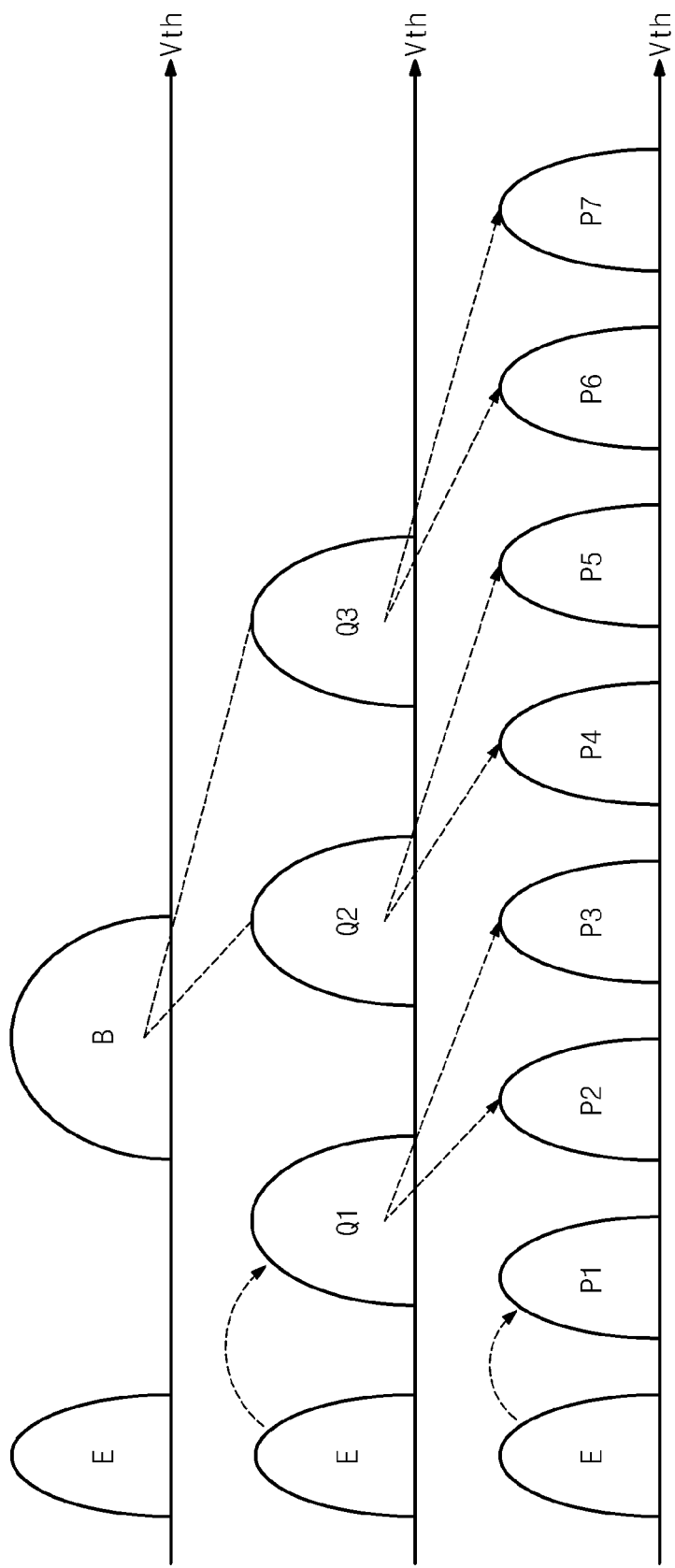
FIG. 15 is a diagram illustrating a method of programming a flash memory device according to another embodiment of the inventive concept.

FIG. 15 is a diagram illustrating a method of programming a flash memory device according to another embodiment of the inventive concept.

In the method of FIG. 15, selected memory cells are programmed according to a shadow programming scheme. Even when performing a programming operation using the shadow programming scheme, the above described methods can be used to determine verification start points. For example, the verification start point of each program state can be determined on the basis of a detected pass bit, a stored pass bit, or a relationship between the detected pass bit or the stored pass bit and a previous state and a target state.

Figure 16:
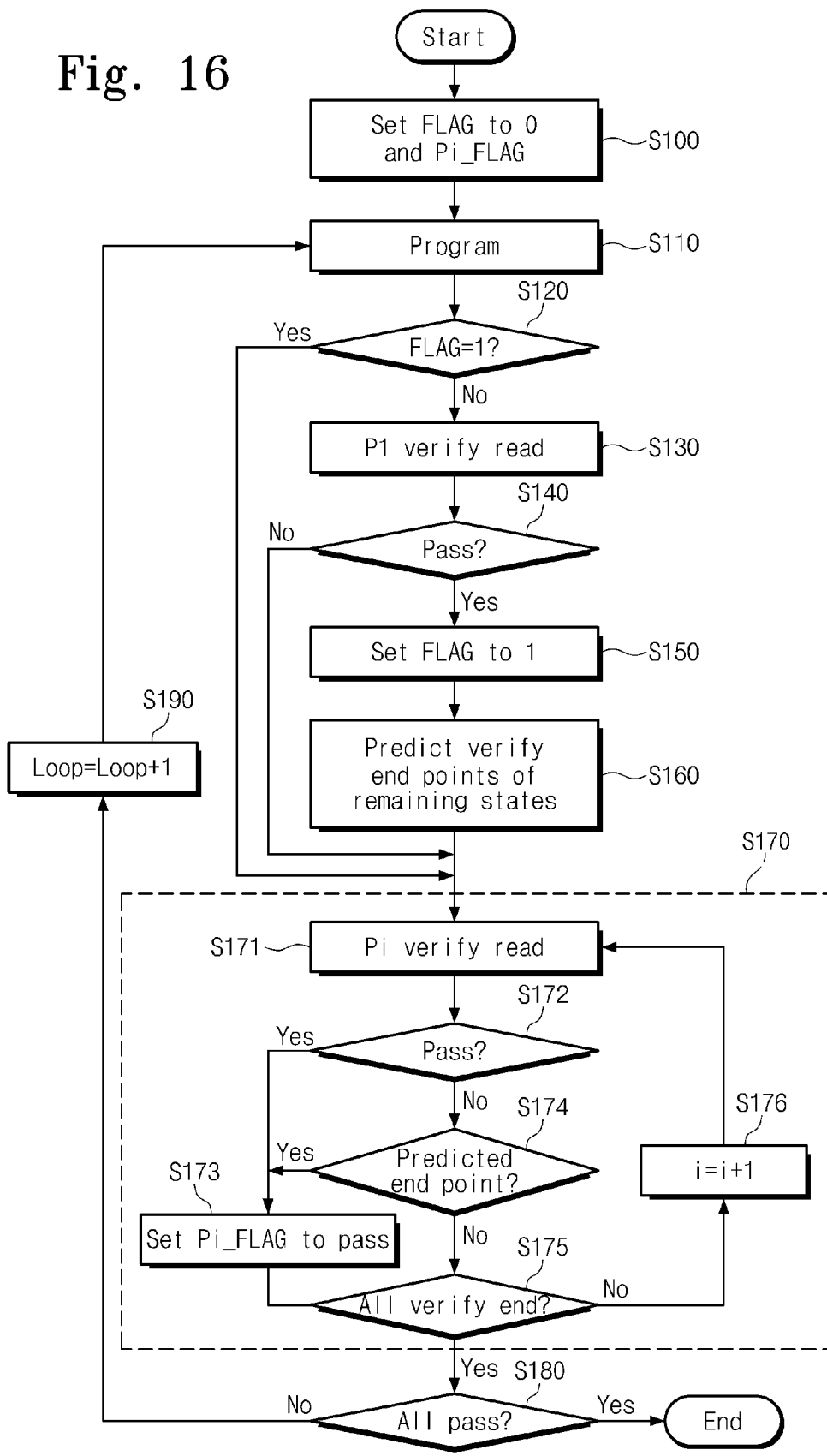
FIG. 16 is a flowchart illustrating a method of programming a flash memory device according to another embodiment of the inventive concept.
Figure 17:
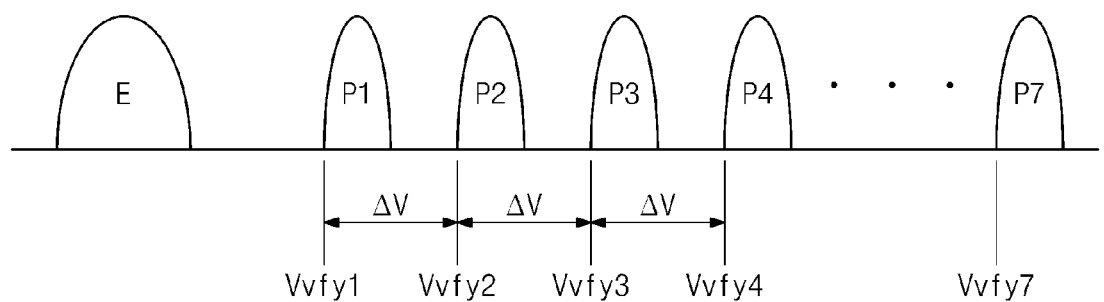
FIG. 17 is a threshold voltage diagram for memory cells storing multi-bit data.

FIG. 16 is a flowchart illustrating a method of programming a flash memory device according to another embodiment of the inventive concept. FIG. 17 is a diagram showing the threshold voltage distributions of multi-bit data programmed by the method of FIG. 16.

In the method of FIG. 16, the flash memory device is programmed using a programming operation comprising a programming execution section and a verification section. The programming execution section changes threshold voltages of selected memory cells of a selected wordline, and the verification section determines whether the threshold voltages of the selected memory cells, which have changed during the programming execution section, have reached corresponding target voltages. A program voltage is applied to the selected wordline during the programming execution section, and a series of verification voltages are sequentially applied to the selected wordline during the verification section. The series of verification voltages correspond to threshold voltage distributions representing multi-bit data in the selected memory cells. Data to be programmed is loaded to the flash memory device before the programming execution section. Previously programmed data can be read before loading of data to be programmed.

Referring to FIG. 16, variables FLAG and Pi_FLAG are set to '0' in operation S100. The variable FLAG is used to indicate whether the lowest program state (for example, state P1 of FIG. 2) is passed, and the variable Pi_FLAG is used to indicate whether other program states are passed. A "passed" status of a program state indicates that all threshold voltages of selected memory cells corresponding to the program state are greater than or equal to a verification voltage of the program state. A passed status of a program state differs from the program pass of a programming operation.

A programming operation is performed in operation S110. Operation S110 corresponds to the programming execution section. Then, operation S120 determines whether the variable FLAG is set to '1'. Where the variable FLAG is not set to '1' (S120=No), the method proceeds to operation S130. In operation S130, a verification operation is performed for program state P1. Then, in operation S140, the method determines whether all of the selected memory cells corresponding to program state P1 have threshold voltages that are greater than or equal to the verification voltages. In other words, operation S140 determines whether program state P1 is passed.

Where program state P1 is determined to be passed (S140=Yes), the method proceeds to operation S150, where the variable FLAG is set to '1'. Thereafter, a verification operation for program state P1 is omitted during the verification section of further program loops. The last point, such as a last program loop, where verification is performed for program state P1 is referred to as a verification end point, or verification end loop. Next, operation S160 predicts verification end points of remaining program states. The verification end points of the remaining program states are predicted as follows.

Where program state P1 is detected as being passed, the method determines or predicts a pass point for each of the remaining program states, where a pass point indicates a program loop or program voltage where a program state is passed. The pass points can then be used to determine verification end points for the remaining program states.

The pass points of the remaining program states are determined by an equation "Vpgm(i)=Vpgm(pass)+Vdiff", where Vdiff indicates a difference voltage "N*ΔV" (where N≥1) between verification voltage VP1 of program state P1 and the verification voltage of another program state, Vpgm(i) (i≥2) indicates the programmed voltage of the pass point of each of remaining program states (for example, program states P2 through P7) other than program state P1, and Vpgm(pass) indicates the program voltage of a point where program state P1 is passed.

Assuming that 3-bit data is stored in each memory cell, as illustrated in FIG. 2, each memory cell has any one of eight threshold voltage distributions corresponding to states E and P1 through P7. Program states P1 through P7 are determined by corresponding verification voltages Vvfy1 through Vvfy7. The state distribution diagram of FIG. 2 is illustrated under a condition where a difference voltage "ΔV" is identical between verification voltages (for example, Vvfy1 and Vvfy2) corresponding to adjacent program states (for example, P1 and P2). However, the voltage differences between verification voltages can vary in other embodiments.

The pass points of remaining program states other than program state P1 are determined as illustrated above. Verification end points of the remaining program states are determined on the basis of the determined pass points. The verification end points are determined through an equation "Vpgm(i)_VE=Vpgm(i)−Voffset(i)", where Vpgm(i)_VE indicates a program voltage corresponding to the verification end point of each of the remaining program states, and Voffset(i) indicates the offset voltage of each of the remaining program states. The offset voltages of the remaining program states can be set to the same value or different values in various embodiments.

In some embodiments, a flash memory device determines whether a verification end point has been reached for a particular program state by comparing a program voltage of a current program loop with a program voltage associated with the verification end point. Alternatively, the flash memory device can determine whether the verification end point has been reached for the particular program state by comparing an index or other identifier of a current program loop with a program loop identifier of the verification end point.

In some embodiments, the verification end point for a program state may occur before all of the relevant memory cells are programmed to that state. This can occur because the verification end point may be determined according to a prediction as described above. Where this occurs, the memory cells that have not been successfully programmed include fail bits. The fail bits can be corrected by an error correction code (ECC) unit of a memory controller during read bits. The fail bits are typically associated with memory cells having a slow programming speed and are called slow bits.

Once the verification end points are determined for the remaining program states P2 through P7, the method proceeds to operation S170. In operation S170, verification operations are performed for the remaining program states P2 through P7, as will be described below. The method also proceeds to operation S170 where operation S120 determines that the variable FLAG is set as '1' (S120=Yes), or where operation S140 determines that program state P1 is not passed (S140=No).

The verification operations of the remaining program states, which are performed in operation S170, are automatically ended based on the verification end points determined in operation S160. As an example, a verification operation is performed for a next program state (e.g., state P2) in operation S171. Operation S172 determines whether the threshold voltages of memory cells corresponding to program state P2 are greater than or equal to verification voltage Vvfy2. That is, operation S172 determines whether all memory cells corresponding to program state P2 are program passed. Where all of the memory cells corresponding to program state P2 are determined as being program passed (S172=Yes), the method proceeds to operation S173. Otherwise (S172=No), the method proceeds to operation S174.

In operation S174, the method determines whether the current program loop has reached a verification end point for program state P2. If so (S174=Yes), the method proceeds to operation S173. Otherwise (S174=No), the method proceeds to operation S175.

In operation S173, the variable Pi_FLAG is set to a passed state to indicate that a verification operation for program state P2 is to be omitted in a next program loop.

In operation S175, the method determines whether all verification operations for remaining program states P2 through P7 have been performed. Where not all of the verification operations for program states P2 through P7 have been performed (S175=No), the method proceeds to operation S176. Otherwise (S175=Yes), the method proceeds to operation S180. In operation S176, the variable 'i' is increased by 1 and the method returns to operation S171.

In operation S180, the method determines whether all program states (e.g., P1 through P7) are passed. Where one or more of the program states is determined as not being passed (S180=No), the method operation proceeds to operation S190. Otherwise (S180=Yes), the method ends.

In operation S190, a variable LOOP indicating a program loop is increased by 1 and the method returns to operation S110. Subsequent program loops are performed until all the program states are determined as being passed.

Figure 18:
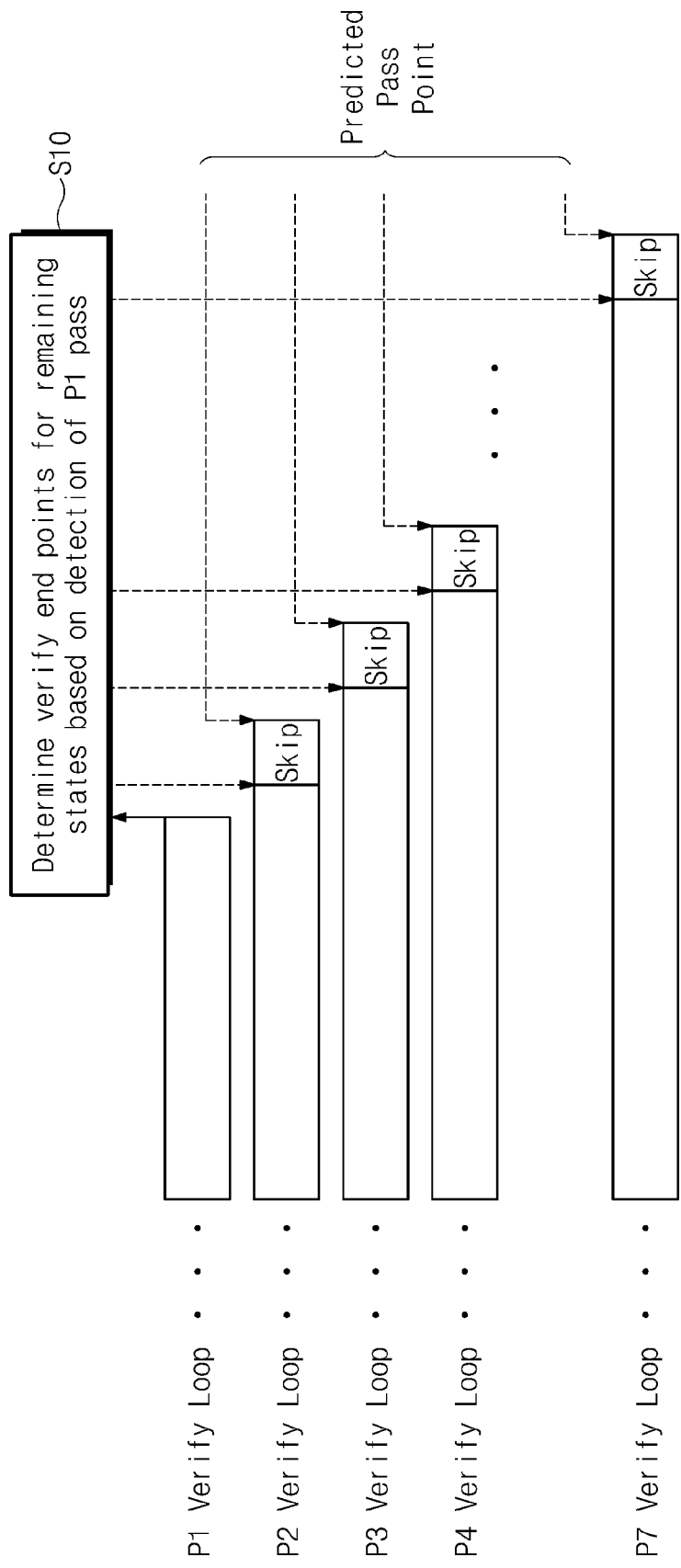
FIG. 18 is a diagram illustrating a verification scheme used in the method of FIG. 16 according to an embodiment of the inventive concept.

FIG. 18 is a diagram illustrating a verification scheme used in the method of FIG. 16 according to an embodiment of the inventive concept.

Referring to FIG. 18, where program state P1 is passed, verification end points for remaining program states P2 to P7 are predicted. Where a current program loop (or program voltage) corresponds to a predicted verification end point of program state, the program state is passed, and verification operations of the program state are ended. As illustrated in FIG. 18, verification operations are omitted for each program state after it reaches a corresponding predicted verification end point.

Figure 19:
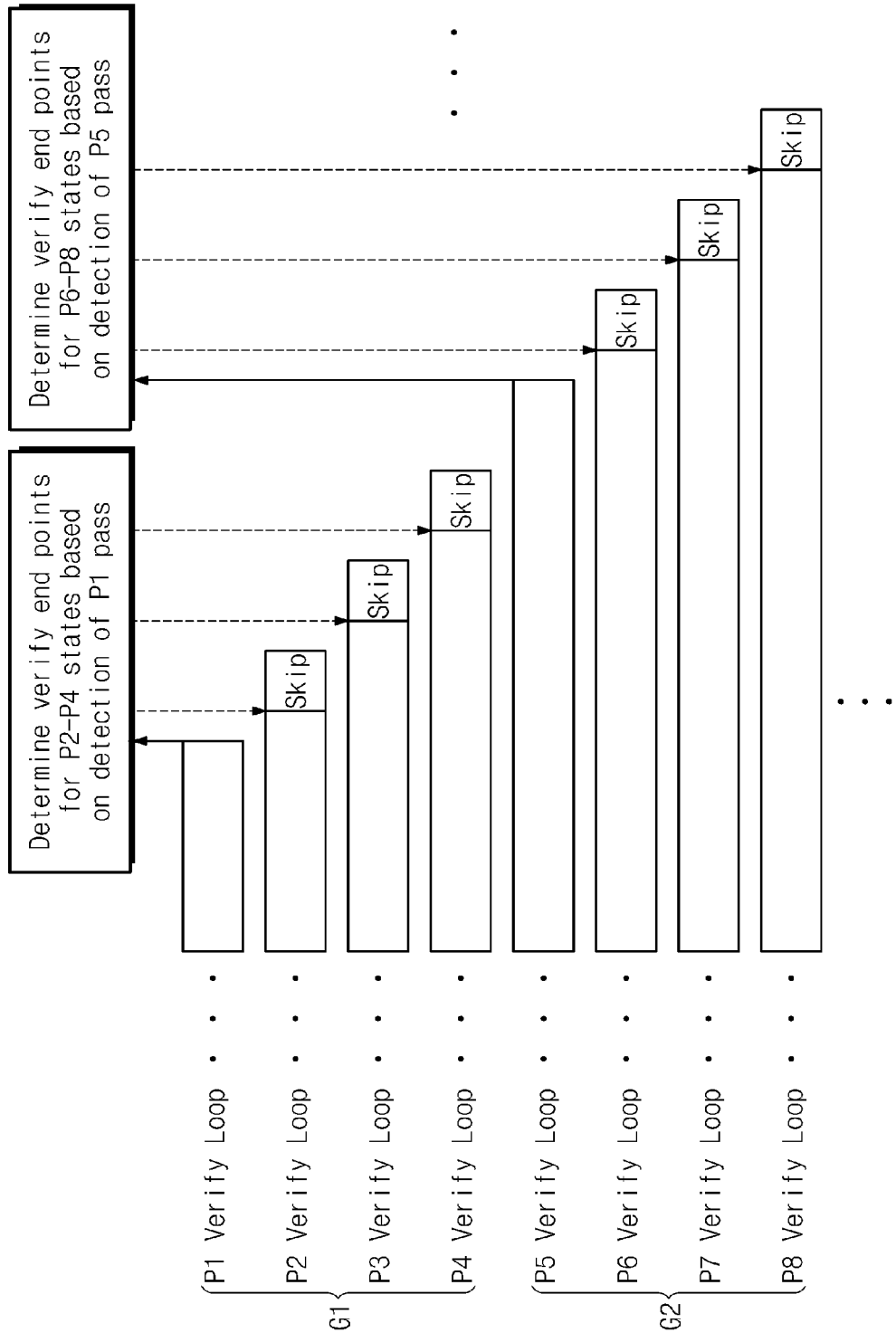
FIG. 19 is a diagram illustrating a verification scheme used in the method of FIG. 16 according to another embodiment of the inventive concept.

FIG. 19 is a diagram illustrating a verification scheme used in the method of FIG. 16 according to another embodiment of the inventive concept.

In the method of FIG. 19, the verification end points of the remaining program states are determined with respect to the pass points of at least two program states among a plurality of program states. For example, program states are divided into "n" groups G1 through Gn. The verification end points of remaining program states belonging to each group are determined with respect to the pass point of a lowest program state belonging to the group. The verification end points can be determined as described above. As an example, in a first group G1, the verification end points of remaining program states P2 through P4 are determined with respect to a pass point of program state P 1. In a second group G2, the verification end points of remaining program states P6 through P8 are determined with respect to a pass point of program state P5.

In other embodiments, the number of program states belonging to each group can be varied. Moreover, offset voltages applied to different groups can be set identically or differently, and the offset voltages of the program states belonging to the same group can be set identically or differently.

Figure 20:
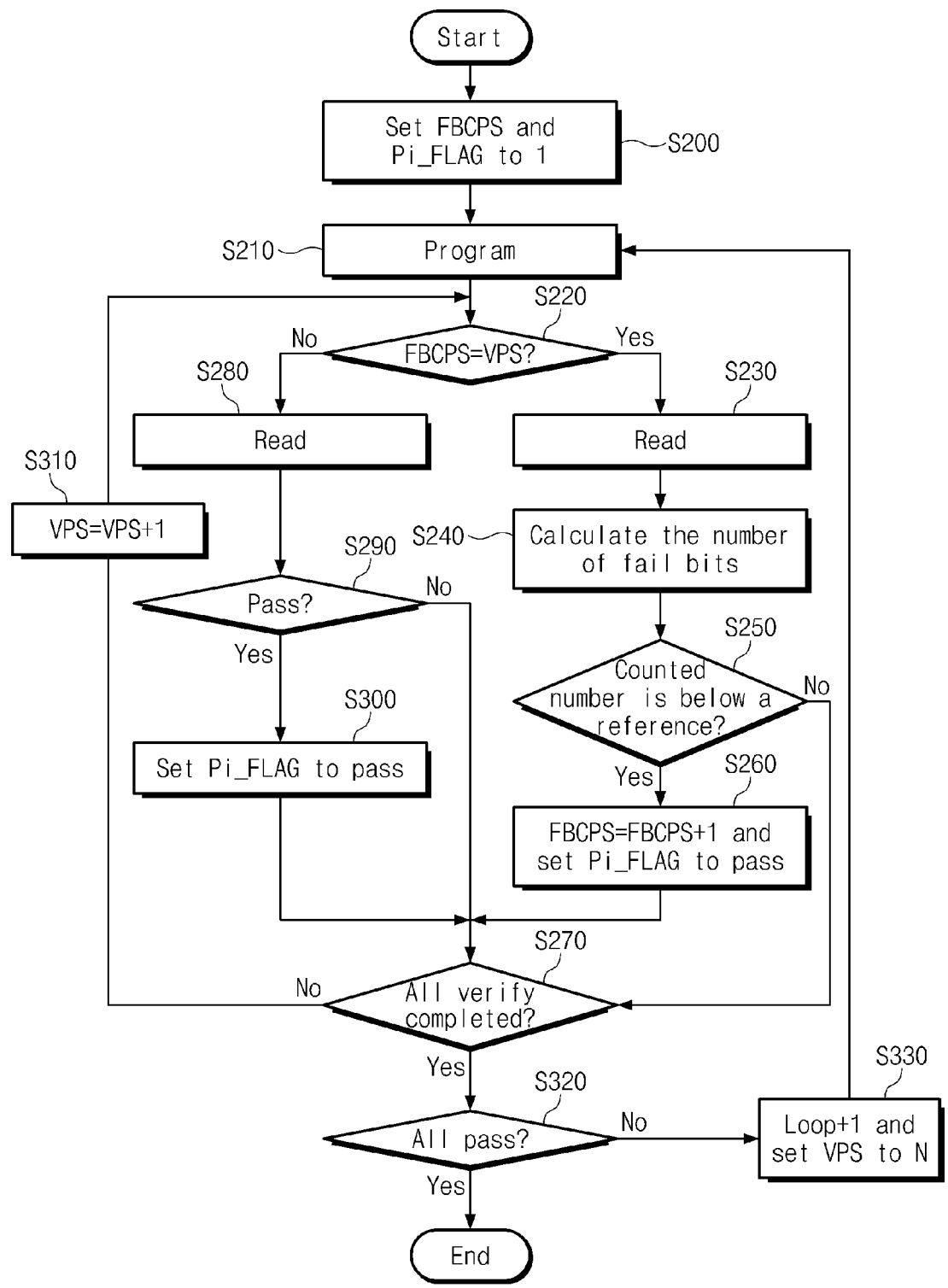
FIG. 20 is a flowchart illustrating a method of programming a flash memory device according to another embodiment of the inventive concept.

FIG. 20 is a flowchart illustrating a method of programming a flash memory device according to another embodiment of the inventive concept.

In the method of FIG. 20, variables FBCPS, VPS, and Pi_FLAG are set to '1' in operation S200. The variable FBCPS indicates a program state where a fail bit count is performed, and the variable VPS indicates a program state where a verification operation is performed. The variable Pi_FLAG is used to indicate the passed status of a program state where a verification operation has been performed.

A programming operation is performed in operation S210. Operation S210 corresponds to a programming execution section. Next, operation S220 determines whether the value of the variable FBCPS is equal to the value of the variable VPS. Assuming that a current program loop is a first program loop, the value of the variable FBCPS is equal to the value of the variable VPS (S220=Yes). Consequently, the method proceeds to operation S230. In operation S230, a verification operation is performed for program state P1, and the method proceeds to operation S240.

Operation S240 counts the number of fail bits among data bits that are read in a verification operation of program state P1. The counting of fail bits can be implemented in various ways. For example, the number of fail bits can be counted based on the amount of a current that flows in selected memory cells during a verification operation. Alternatively, the number of fail bits can be counted using a counter.

Next, in operation S250, the method determines whether the counted number of fail bits is less than a predetermined reference value. Where the counted number of fail bits is less than the predetermined reference value (S250=Yes), the method proceeds to operation S260. Otherwise (S250=No), the method proceeds to operation S270. In operation S250, the reference value is determined according to the error correction capability of an ECC unit of the memory controller. In operation S260, the value of the variable FBCPS is increased by 1 and the variable Pi_FLAG is set to indicate a passed status. In other words, first program state P1 is determined to have a passed status, and consequently, a verification operation for program state P1 is omitted in successive program loops. Following operation, the method proceeds to operation S270.

As indicated by the above description, where the number of fail bits among data bits corresponding to a program state is less than the predetermined reference value, a program state is determined to have a passed status. Consequently, verification operations of the program state can be omitted even where the data bits corresponding to the program state include the fail bits. The fail bits are slow bits. In other words, where the number of fail bits among the data bits corresponding to the program state is less than the predetermined reference value, a verification operation for a slow bit is omitted.

Returning to operation S220, where the value of the variable FBCPS is not equal to that of the variable VPS (S220=No), the method proceeds to operation S280. Where the counted number of fail bits for program state P1 is greater than the reference value, the value of the variable FBCPS is not changed. In this case, assuming that a present verification operation is associated with a verification operation for second program state P2 or another higher program state, the value of the variable FBCPS, which indicates a program state where the number of fail bits has been counted, is not equal to the value of the variable VPS, which indicates a program state where the verification operation is performed.

In operation S280, a verification operation is performed for a current program state corresponding to the value of the variable VPS, and the method proceeds to operation S290. In operation S290, the method determines whether all read data bits are passed data bits. Where all of the read data bits are passed data bits (S290=Yes), the variable Pi_FLAG is set to indicate a passed status for the current program state, and the method proceeds to operation S300. Otherwise (S290=No), the method proceeds to operation S270. In operation S270, the method determines whether all verification operations for the program states have been performed. If not (S270=No), the method proceeds to operation S310. Otherwise (S270=Yes), the method proceeds to operation S320.

In operation S310, the value of the variable VPS, which indicates a program loop where a verification operation is to be performed, is increased by 1, and the method returns to operation S220. In operation S320, the method determines whether all program states are passed. Where at least one of the program states is not passed (S320=No), operation S330 increases the value of a program loop by 1, and sets the variable VPS to 'N'. In operation S330, "N" has a value indicating a lowest program state among the program states that are not passed. Following operation S330, the method returns to operation S210. Where all the program states are determined as being passed (S320=Yes), the method ends.

In certain embodiments, the method of FIG. 20 can be modified so that it determines, between operations S230 and S240, whether a program state is passed.

Figure 21:
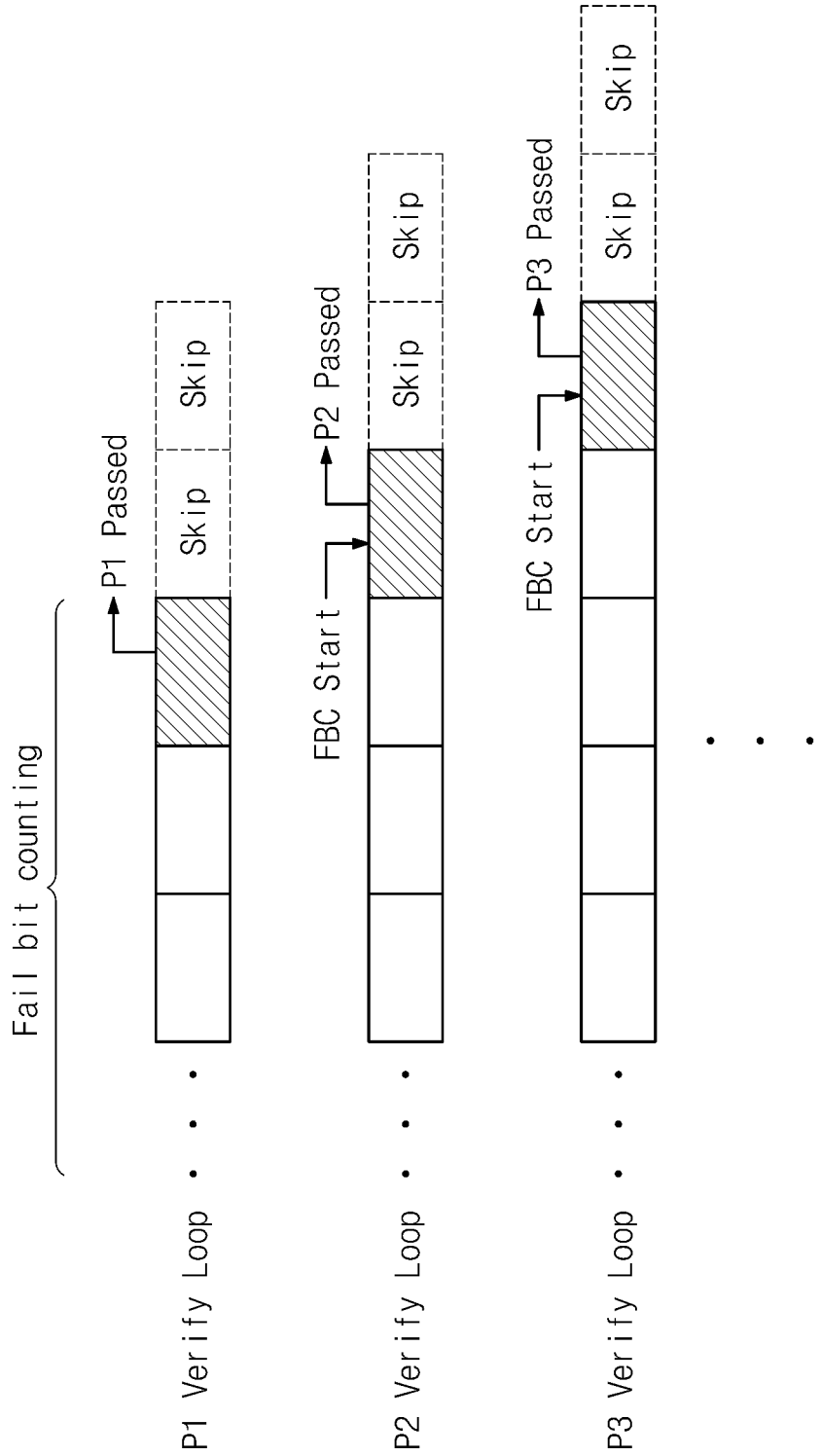
FIG. 21 is a diagram illustrating a verification scheme used in the method of FIG. 20 according to an embodiment of the inventive concept.

FIG. 21 is a diagram illustrating a verification scheme used in the method of FIG. 20 according to an embodiment of the inventive concept.

Referring to FIG. 21, a bit count operation for first program state P1 is performed until the number of fail bits becomes less than a predetermined reference value. At this point, a fail bit count operation for remaining program states is not performed. Once the number of fail bits of first program state P1 becomes less than the predetermined reference value, a verification operation for first program state P1 is ended, and a fail bit count operation for second program state P2 is started. At this point, a fail bit count operation is not performed for remaining program states (i.e., the upper program states of the second program state). Where the number of fail bits of second program state P2 becomes less than the predetermined reference value, a verification operation for second program state P2 is ended, and a fail bit count operation for third program state P3 is started. A fail bit count operation for remaining program states is determined through the substantially same scheme as shown in FIG. 21.

Figure 22:
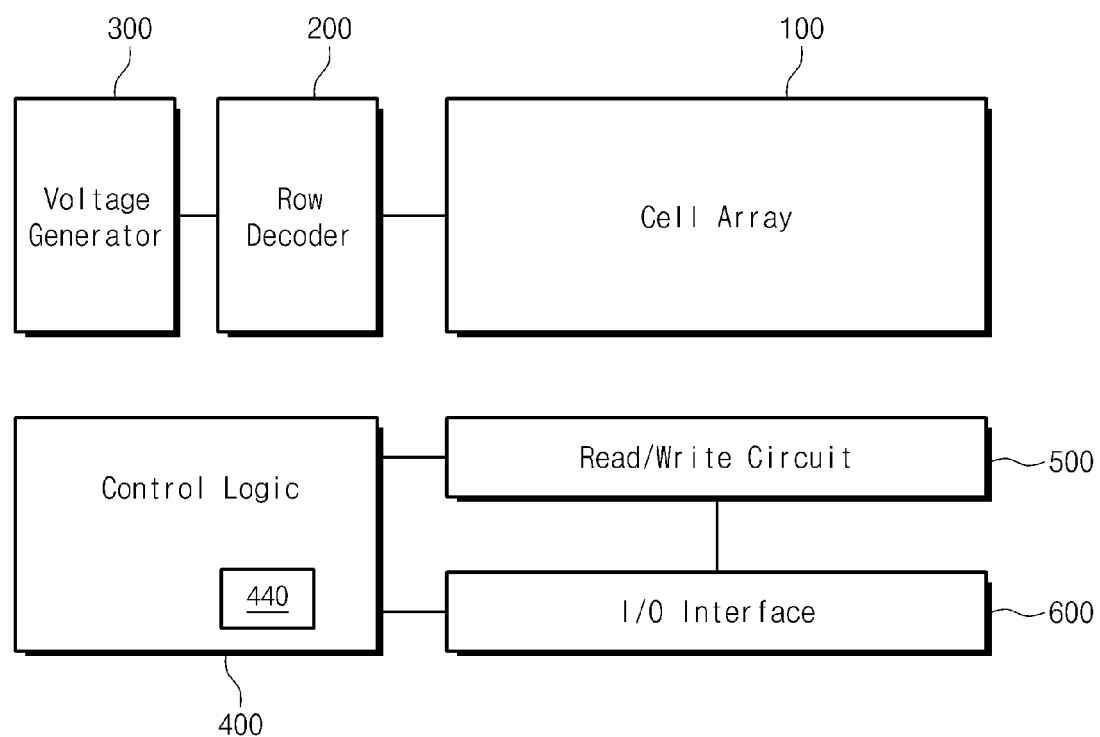
FIG. 22 is a block diagram illustrating a flash memory device capable of performing the method of FIG. 20.

FIG. 22 is a block diagram illustrating a flash memory device capable of performing the method of FIG. 20.

The device of FIG. 22 is substantially the same the device of FIG. 1, except that that the device of FIG. 22 further comprises a circuit 440 within control logic 400 for counting the number of fail bits using current sensing. The counting of the number of fail bits is not limited to current sensing, and can be implemented using other techniques, such as a counter.

Figure 23A:
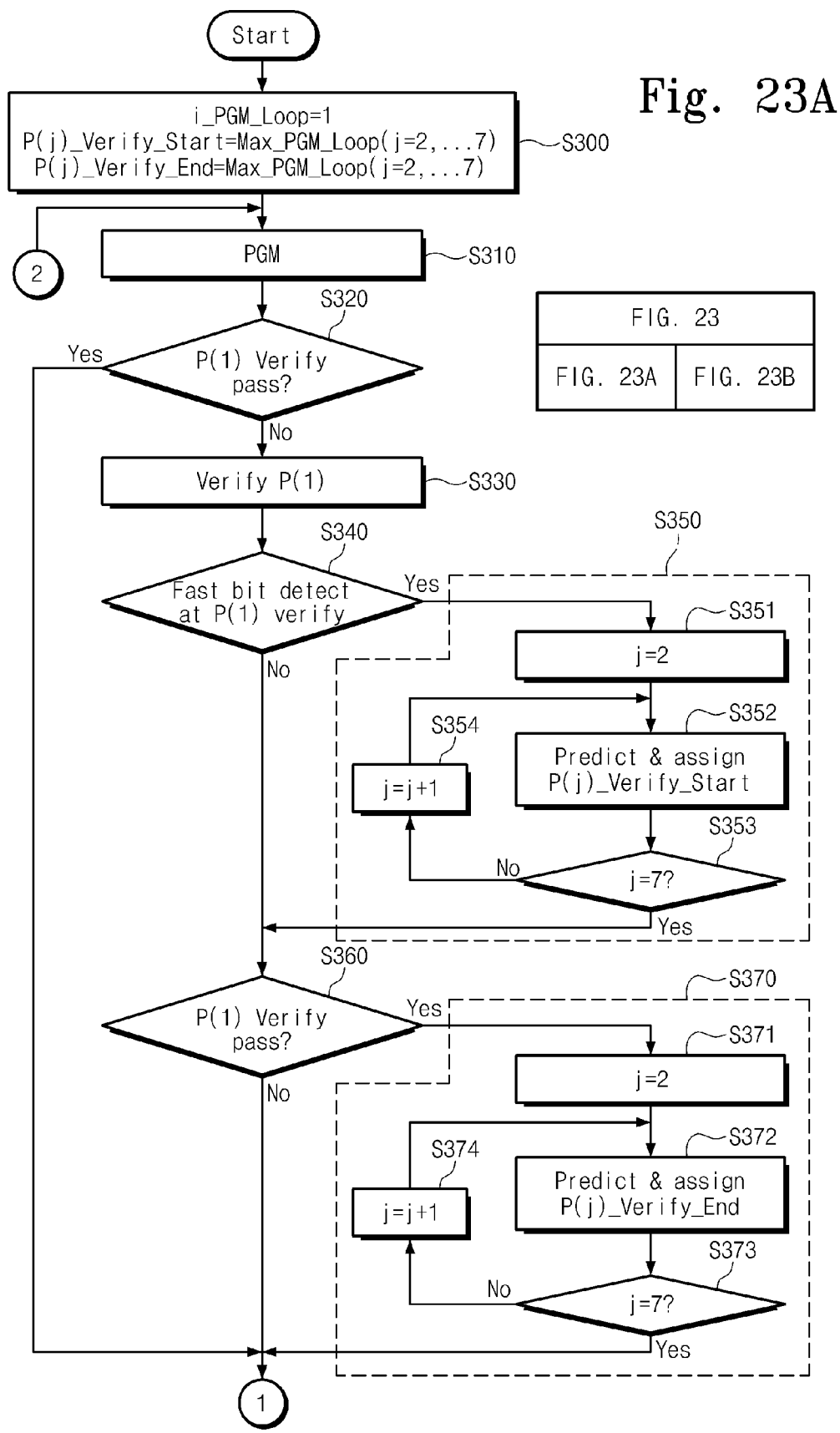
FIGS. 23A and 23B are flowcharts illustrating a method of programming a flash memory device according to another embodiment of the inventive concept.
Figure 23B:
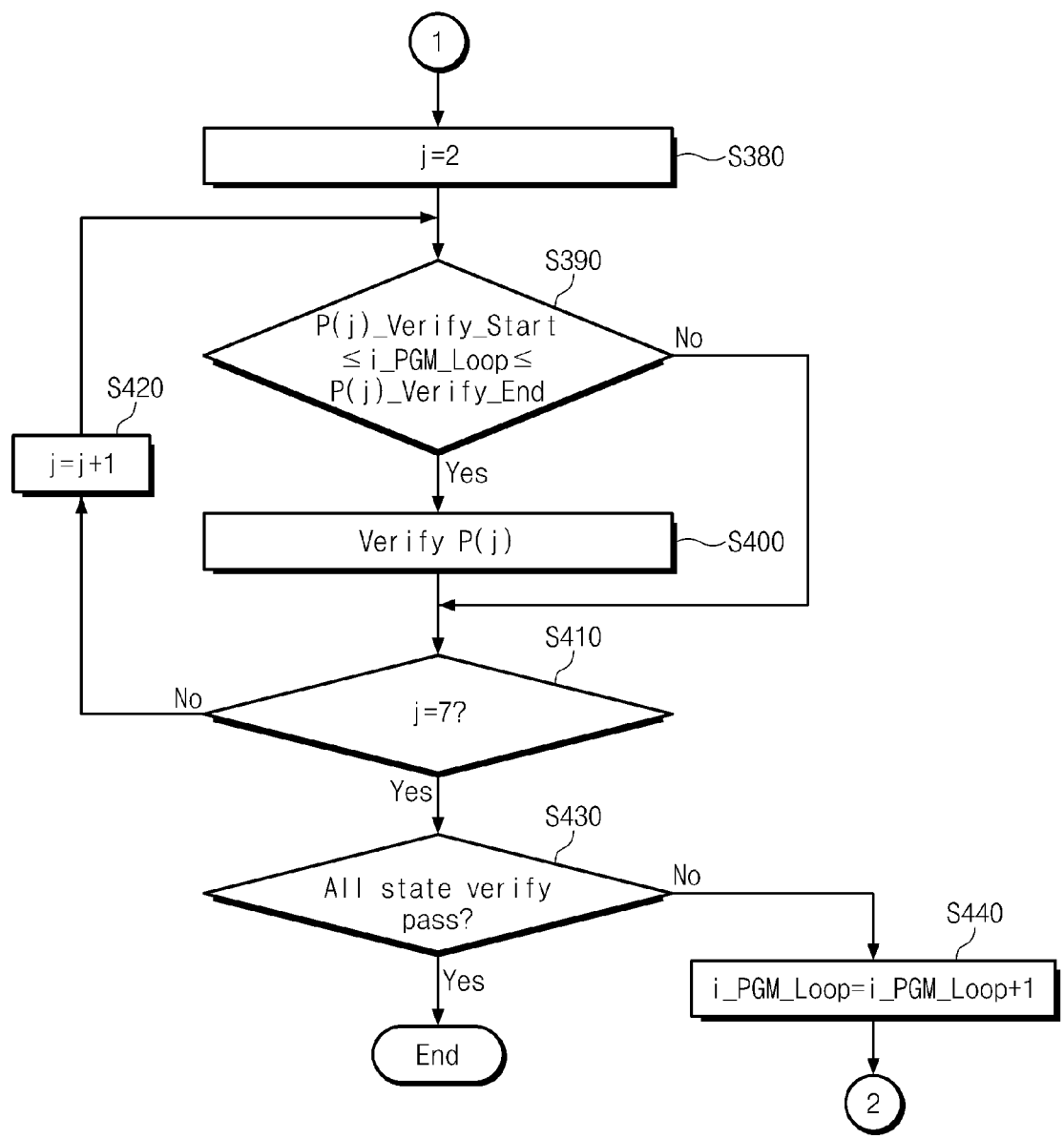

FIGS. 23A and 23B are flowcharts illustrating a method of programming a flash memory device according to another embodiment of the inventive concept.

In the example of FIGS. 23A and 23B, it is assumed that 3-bit data is stored in each memory cell using one erased state E and seven program states P1 through P7. In addition, the method of FIG. 23 can incorporate the scheme for determining the verification start point as described above with reference to FIG. 6 or FIG. 8 and the scheme for determining the verification end point as described above with reference to FIG. 16. Verification operations for fast bits can be skipped using verification start point determination, and verification operations for slow bits can be skipped through the verification end point determining scheme.

Referring to FIG. 23A, in operation S300, upon initiation of a programming operation, a variable i_PGM_Loop is set as '1', and variables P(D_Verify_Start and P(j)_Verify_End are respectively set as maximum program loop times Max_PGM_Loop. The variable i_PGM_Loop indicates a current program loop, the variable P(j)_Verify_Start indicates a verification start point for a j-th program state, and the variable P(j)_Verify_End indicates a verification end point for a j-th program state. Next, in operation S310, a programming operation is executed under the control of control logic 400.

Thereafter, in operation S320, upon completion of the programming operation, the method determines whether program state P1 is passed. Where the verification operation determines that program state P1 is not passed (S320=No), the method proceeds to operation S330.

In operation S330, a verification operation is performed for program state P1 to determine whether at least one selected memory cell has been successfully programmed to program state P1. In other words, operation S330 determines whether the selected memory cells include a pass bit.

Where a pass bit is detected during the verification operation of program state P1 (S340=Yes), the method proceeds to operation S350. Otherwise (S340=No), the method proceeds to operation S360.

Operation S350 implements a method such as those described with reference to FIG. 6 and FIG. 8 to predict verification start points P(j)_Verify_Start of remaining program states P2 through P7 on the basis of a detected pass bit. In particular, operation S350 comprises setting a variable 'j' to 2 in operation S351; predicting a verification start point P(j)_Verify_Start of a j-th program state in operation S352; determining whether 'j' has reached 7 indicating a most significant bit (MSB) program state P7 in operation S353; and increasing 'j' by 1 where 'j' has not reached 7 (S353=No) in operation S354.

Verification start points can also be predicted according to the scheme that has been described above with reference to FIGS. 13 and 14. After the verification start points P(j)_Verify_Start of the remaining program states P2 through P7 are predicted in operation S350, the method proceeds to operation S360.

In operation S360, the method determines whether program state P1 is passed. Upon determining that program state P1 is passed (S360=Yes), the method proceeds to operation S370. Otherwise (S360=No), the method proceeds to operation S380.

Operation S370 uses a method similar to that described with reference to FIG. 16 to predict verification end points P(j)_Verify_End of the remaining program states P2 through P7. In particular, operation S370 comprises setting 'j' to indicate program state P2 in operation S371; predicting a verification end point P(j)_Verify_End of the j-th program state in operation S372; determining whether 'j' has reached 7 in operation S373; and increasing 'j' by 1 where 'j' has not reached 7 (S373=No) in operation S374. After the verification end points P(j)_Verify_End of the remaining program states P2 through P7 are predicted in operation S370, the method proceeds to operation S380.

In operation S380, the method sets 'j' to 2 to indicate program state P2. Next, in operation S390, the method determines whether a current program loop i_PGM_Loop is between the verification start point P(j)_Verify_Start and the verification end point P(j)_Verify_End of program state P(j). If so, the verification operation of program state P(j) is performed. Otherwise, the verification operation is omitted.

Where operation S390 determines that the current program loop i_PGM_Loop is greater than or equal to the verification end point P(j)_Verify_End of program state P(j) or is less than or equal to the verification end point P(j)_Verify_End of program state P(j) (S390=Yes), the method proceeds to operation S400. Otherwise (S390=No), the method proceeds to operation S410.

In operation S400, the method performs the verification operation of program state P(j) and proceeds to operation S410. In operation S410, the method determines whether 'j' has reached 7 indicating program state P7. Where 'j' has not reached 7 (S410=No), 'j' is increased by 1 in operation S420 and the method returns to operation S390. Otherwise (S410=Yes), the method proceeds to operation S430. In operation S430, the method determines whether all program states are passed. If not (S430=No), operation S440 is performed to increase variable i_PGM_Loop by 1. Otherwise (S430=Yes), the method ends. After operation S440, the method returns to operation S310.

Figure 24A:
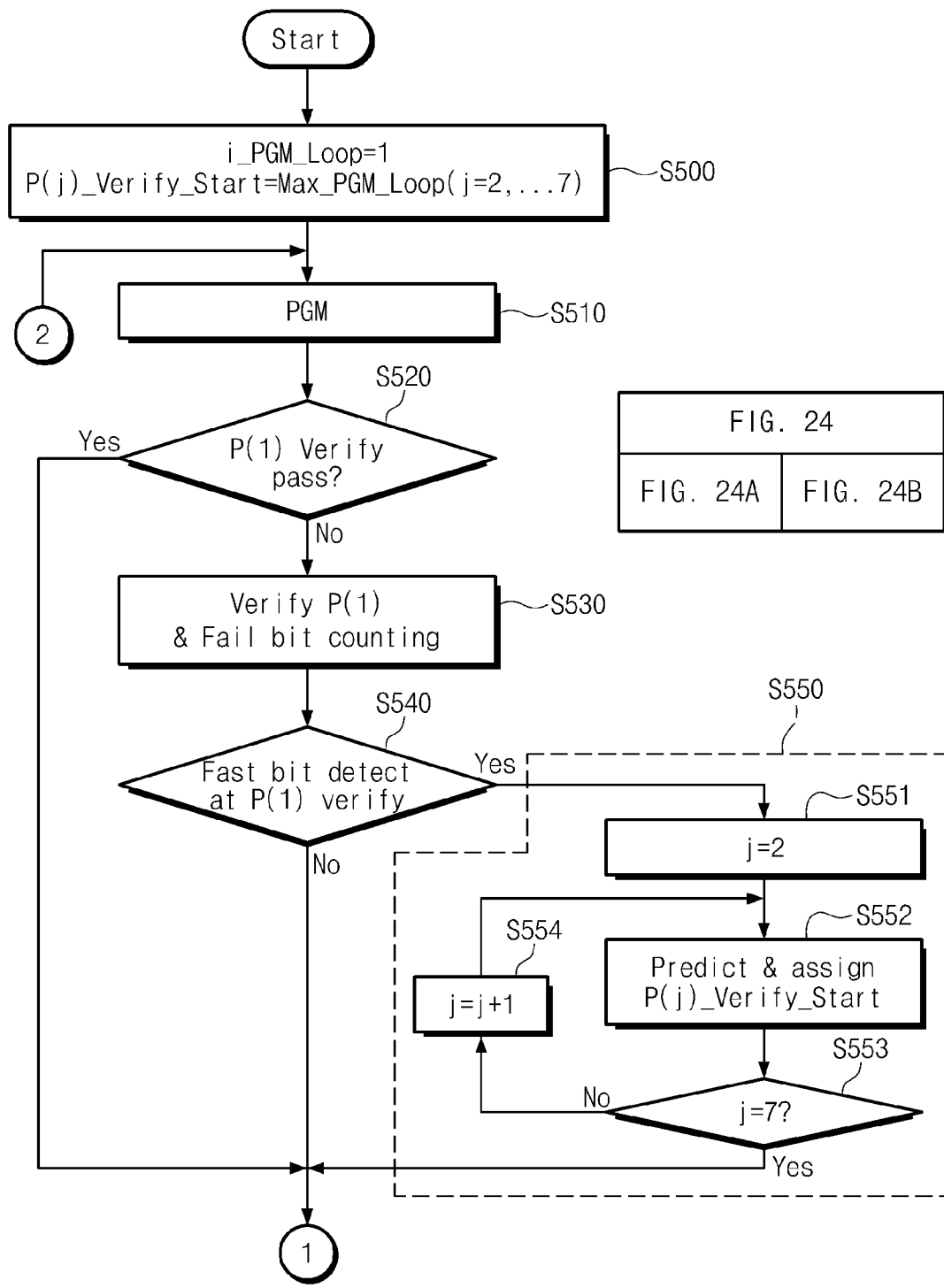
FIGS. 24A and 24B are flowcharts illustrating a method of programming a flash memory device according to another embodiment of the inventive concept.
Figure 24B:
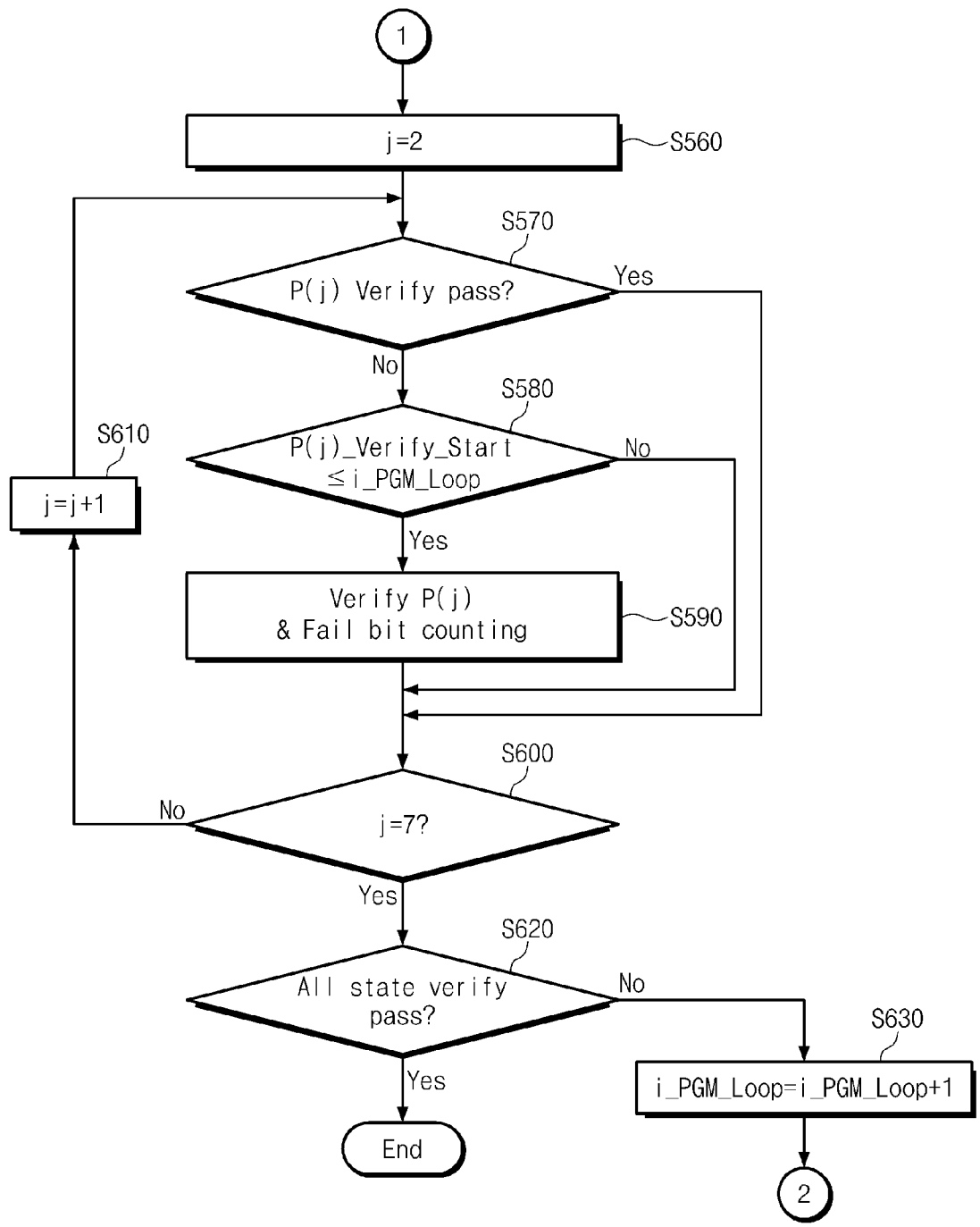

FIGS. 24A and 24B are flowcharts illustrating a method of programming a flash memory device according to another embodiment of the inventive concept.

In the method of FIGS. 24A and 24B, it is assumed that 3-bit data is stored in each memory cell using one erased state E and seven program states P1 through P7. In addition, the method of FIG. 24 can include the scheme for predicting verification start points as described above with reference to FIG. 6 or FIG. 8 and the scheme of predicting verification end points as described above with reference to FIG. 20. In the method of FIGS. 24A and 24B, verification operations for fast bits are skipped according to the verification start point predicting scheme, and verification operations for slow bits are skipped according to the verification end point predicting scheme.

Referring to FIG. 24A, operation S500 is performed upon initiation of a programming operation to set a variable i_PGM_Loop is to '1', and to set variables P(j)_Verify_Start and P(j)_Verify_End as maximum program loop times Max_PGM_Loop. The variable i_PGM_Loop indicates a current program loop, and the variable P(j)_Verify_Start indicates a verification start point for a j-th program state. Next, in operation S510, a programming operation is executed under the control of control logic 400.

After the programming operation, operation S520 determines whether program state P1 is passed. Where program state P1 is not passed (S520=No), the method proceeds to operation S530. Otherwise (S520=Yes), the method proceeds to operation S560. In operation S530, the method performs a verification operation for program state P1 and determines the number of fail bits for program state P1. As described above with reference to FIG. 20, where the number of fail bits for program state P1 is less than or equal to a reference value, program state P1 is set as being passed.

Next, in operation S540, the method determines whether at least one pass bit (i.e., a fast bit) is detected during the verification operation of program state P1. Where a pass bit is detected (S540=Yes), the method proceeds to operation S550. Otherwise (S540=No), the method proceeds to operation S560. Operation S560 comprises operations similar to those described above with reference to FIG. 6 or FIG. 8, in which the verification start points P(j)_Verify_Start of remaining program states P2 through P7 are predicted on the basis of a detected pass bit. Accordingly, operation S550 comprises setting a variable 'j' to 2 in operation S551; predicting a verification start point P(j)_Verify_Start of a j-th program state in operation S552; determining whether 'j' has reached 7 in operation S553; and increasing 'j' by 1 where 'j' has not reached 7 (S553=No) in operation S554. Verification start points can be predicted according to the scheme that has been described above with reference to FIGS. 13 and 14. After the verification start points P(j)_Verify_Start of the remaining program states P2 through P7 are predicted in operation S550, the method proceeds to operation S560.

In operation S560, the method sets 'j' to 2 to indicate program state P2. Then, in operation S570, the method determines whether program state P(j) is passed. Where program state P(j) is not passed (S570=No), the method proceeds to operation S580. Otherwise (S570=Yes), the method proceeds to operation S600. In operation S580, the method determines whether the predicted verification start point of program state P(j) is less than or equal to a current program loop i_PGM_Loop. Where the current program loop i_PGM_Loop is less than the verification start point P(j)_Verify_Start of program state P(j), the verification operation of program state P(j) is omitted. Where the current program loop i_PGM_Loop is greater than the verification start point P(j)_Verify_Start of program state P(j), the verification operation of program state P(j) is performed.

Where the current program loop i_PGM_Loop is greater than or equal to the verification start point P(j)_Verify_Start of program state P(j), the method proceeds to operation S590. In operation S590, a verification operation is performed for program state P(j) and the number of fail bits for program state P(j) is counted. As described above with reference to FIG. 20, where the number of fail bits for program state P(j) is less than or equal to a reference value, program state P(j) is set as being passed. In other embodiments, as described above with reference to FIG. 20, a fail bit detecting operation for program state P(j) is performed after program state P1 is passed. Following operation S590, the method proceeds to operation S600.

In operation S600, the method determines whether 'j' has reached 7 indicating program state P7. Where 'j' has not reached 7 (S600=No), 'j' is increased by 1 in operation S610. Otherwise (S600=Yes), the method proceeds to operation S620.

In operation S620, the method determines whether all of program states P1 through P7 are passed. If so (S620=Yes), the method ends. Otherwise (S620=No), operation S630 is performed to increase the variable i_PGM_Loop by 1, and the method returns to operation S510.

Figure 25A:
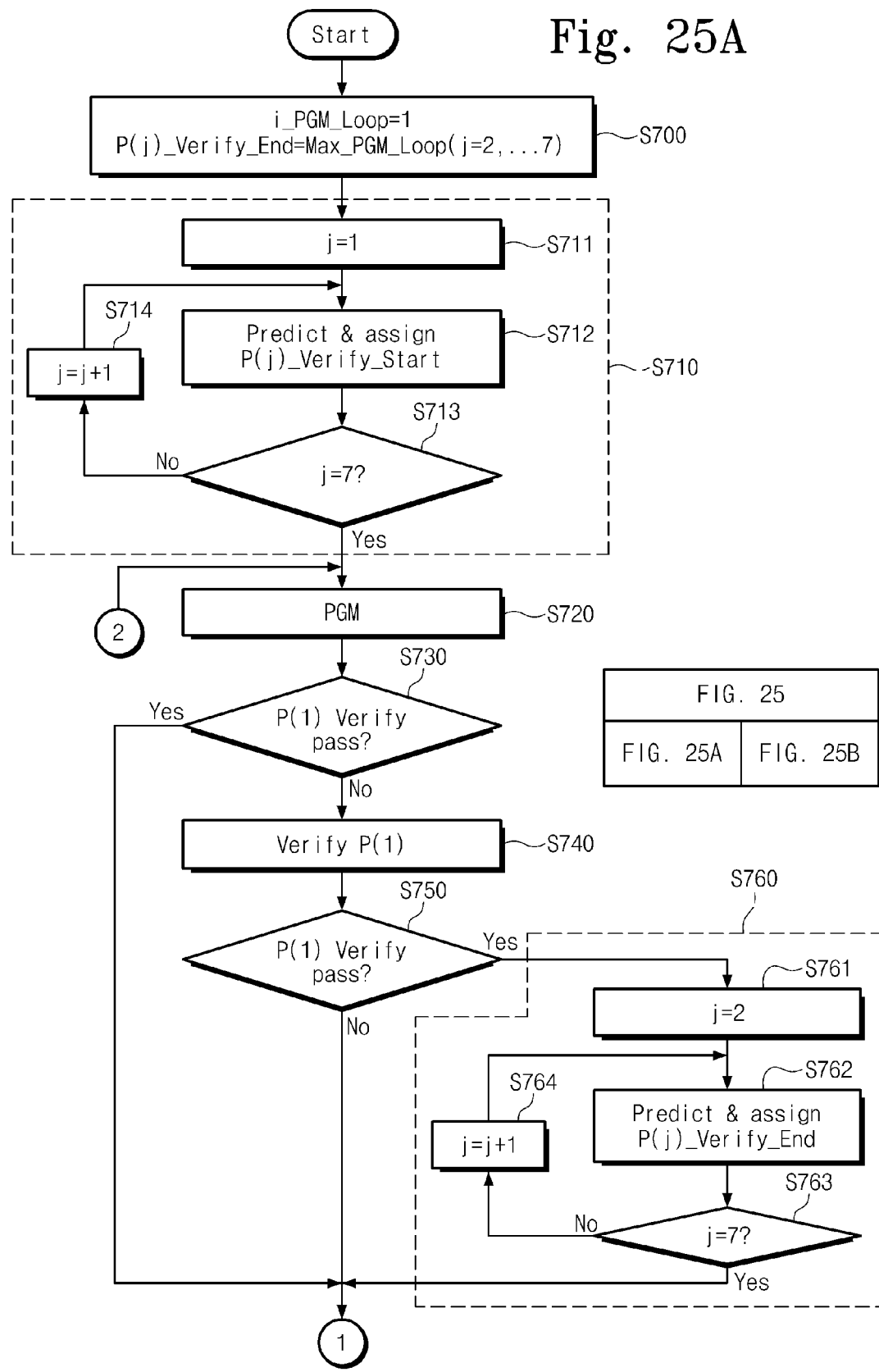
FIGS. 25A and 25B are flowcharts illustrating a method of programming a flash memory device according to another embodiment of the inventive concept.
Figure 25B:
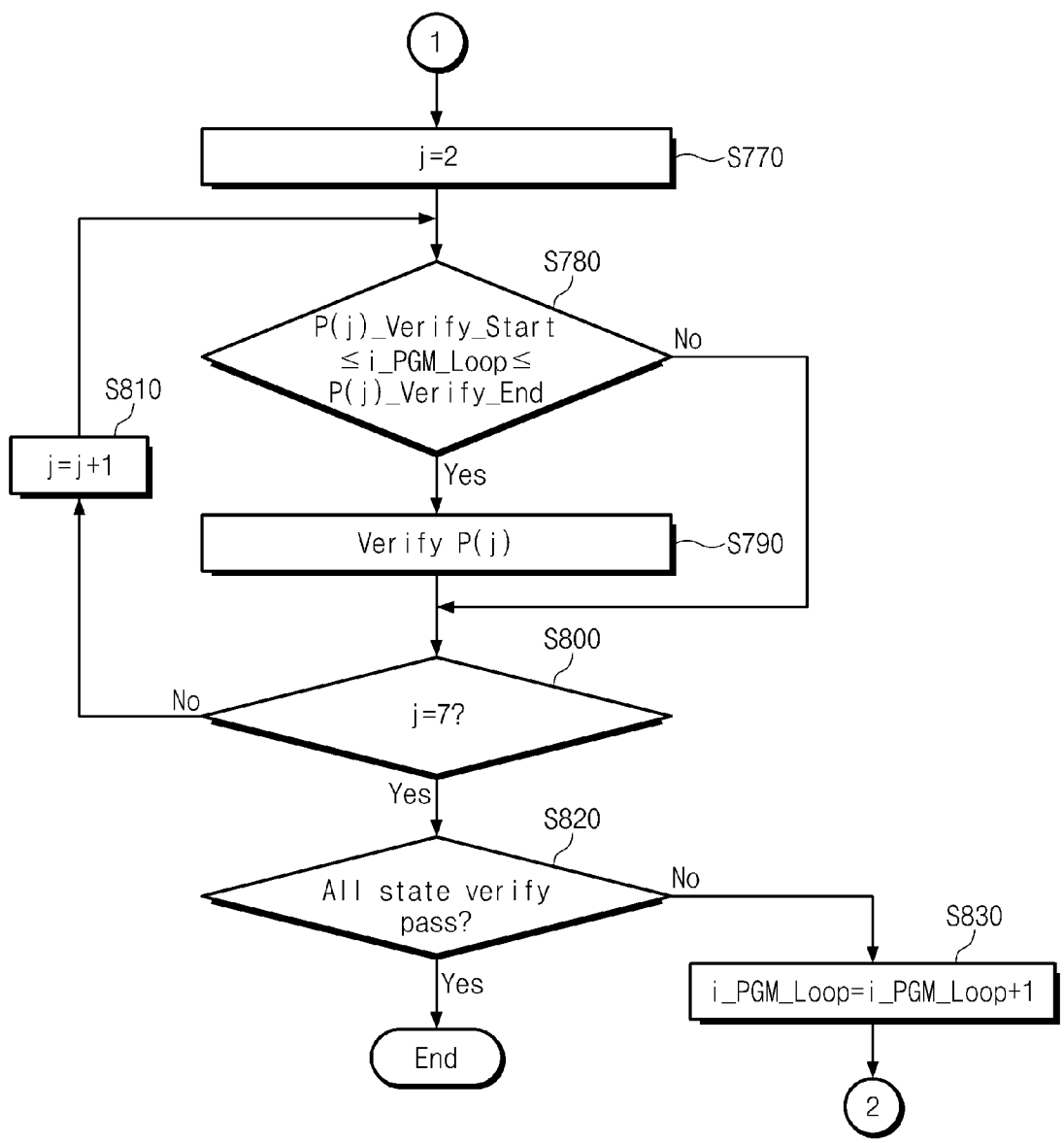

FIGS. 25A and 25B are flowcharts illustrating a method of programming a flash memory device according to still another embodiment of the inventive concept.

In the method of FIGS. 25A and 25B, it is assumed that 3-bit data is stored in each memory cell using one erased state E and seven program states P1 through P7. In addition, the method of FIGS. 25A and 25B use the scheme for predicting the verification start point as described above with reference to FIG. 10 and the scheme for predicting the verification end point as described above with reference to FIG. 16. A verification operation for fast bits can be skipped according to the verification start point predicting scheme, and a verification operation for slow bits can be skipped according to the verification end point predicting scheme.

Referring to FIG. 25A, upon initiation of a programming operation, operation S700 is performed to set a variable i_PGM_Loop to '1', and to set variables P(j)_Verify_Start and P(j)_Verify_End as maximum program loop times Max_PGM_Loop. The variable i_PGM_Loop is used to indicate a current program loop, and the variable P(j)_Verify_End is used to indicate a verification end point for a j-th program state. Next, in operation S710, the verification start points of program states P1 through P7 are predicted on the basis of pass bit information (e.g., a program voltage or a program loop) from a previous page or previous step programming operation. In particular, operation S710 comprises setting a variable 'j' to 1 in operation S711; predicting a verification start point of program state P(j) in operation S712; determining whether 'j' has reached 7 indicating program state P7 in operation S713; increasing 'j' by 1 where 'j' has not reached 7 (S713=No) in operation S714. Where 'j' has reached 7 (S713=Yes), the method proceeds to operation S720. In operation S720, a programming operation is performed under the control of control logic 400.

After the programming operation, operation S730 determines whether program state P1 is passed. Where program state P1 is not passed (S730=No), a verification operation is performed for program state P1 in operation S740. Otherwise (S730=Yes), the method proceeds to operation S770.

In operation S750, the method determines whether program state P1 is passed. Where program state P1 is passed (S750=Yes), the method proceeds to operation S760. Otherwise (S750=No), the method proceeds to operation S770.

Operation S760 is performed similar to the method of FIG. 16, in which the verification end points P(j)_Verify_End of remaining program states P2 through P7 are predicted. In particular, operation S760 comprises setting 'j' to 2 in operation S761; predicting a verification end point P(j)_Verify_End of a j-th program state in operation S762; determining whether 'j' has reached 7 in operation S763; and increasing 'j' by 1 in operation S764 if 'j' has not reached 7 (S763=No). After the verification end points P(j)_Verify_End of the remaining program states P2 through P7 are predicted in operation S760, the method proceeds to operation S770.

In operation S770, 'j' is set to 2 to indicate program state P2. Then, in operation S780, the method determines whether a current program loop i_PGM_Loop is between the verification start point P(j)_Verify_Start of program state P(j) and the verification end point P(j)_Verify_End of program state P(j). If so, the verification operation of program state P(j) is performed in the current program loop. Otherwise, it is omitted. Where operation S780 determines that the current program loop i_PGM_Loop is greater than or equal to the verification start point P(j)_Verify_Start of program state P2 and less than or equal to the verification end point P(j)_Verify_End of program state P2 (S780=Yes), the method proceeds to operation S790. Otherwise, the method proceeds to operation S800. In operation S790, the verification operation of program state P2 is performed, and the method proceeds to operation S800.

Operation S800 determines whether 'j' has reached 7 indicating program state P7. Where 'j' has not reached 7 (S800=No), 'j' is increased by 1 in operation S810, and the method returns to operation S780. Otherwise (S800=Yes), the method proceeds to operation S820. Operation S820 determines whether the all program states are passed. Where not all program states are passed (S820=No), operation S830 is performed to increase the variable i_PGM_Loop by 1, and the method then returns to operation S720. Otherwise (S820=Yes), the method ends.

Figure 26A:
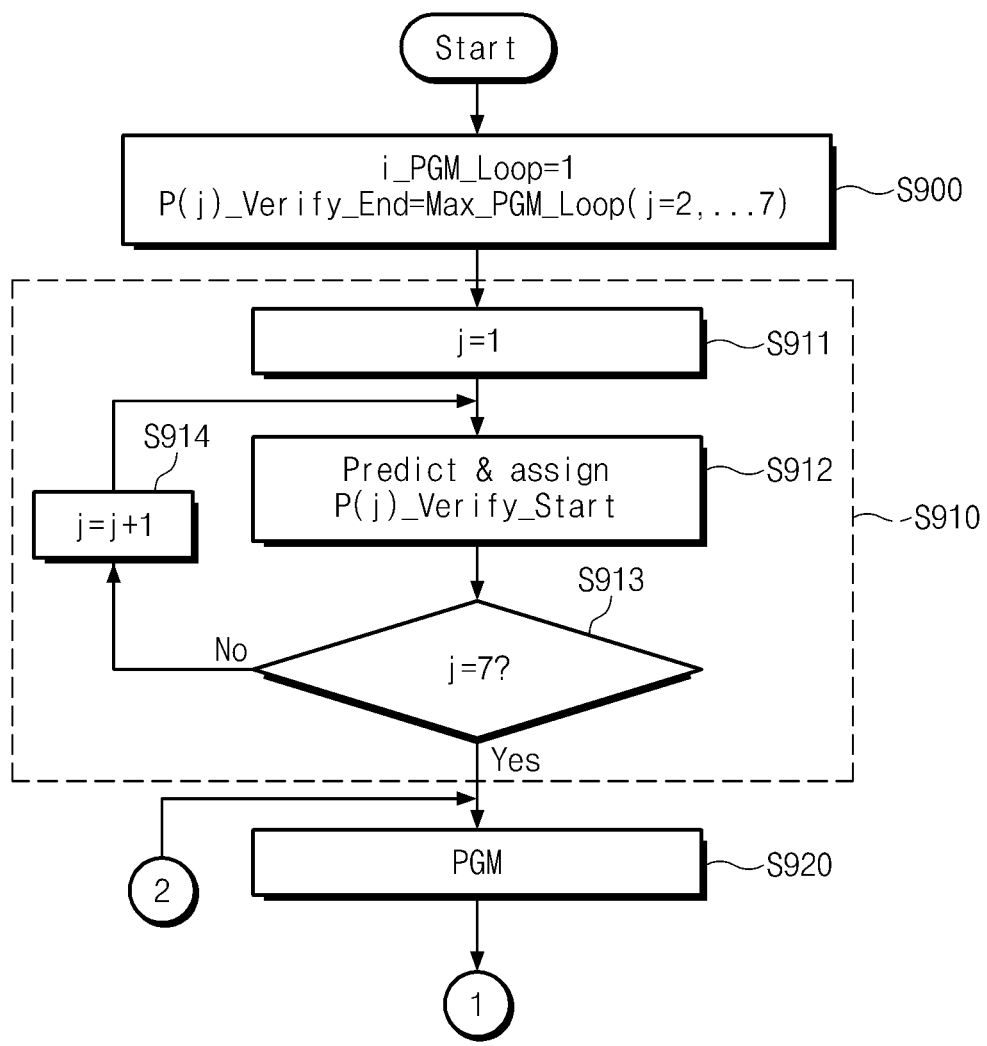
FIGS. 26A and 26B are flowcharts illustrating a method of programming a flash memory device according to another embodiment of the inventive concept.
Figure 26B:
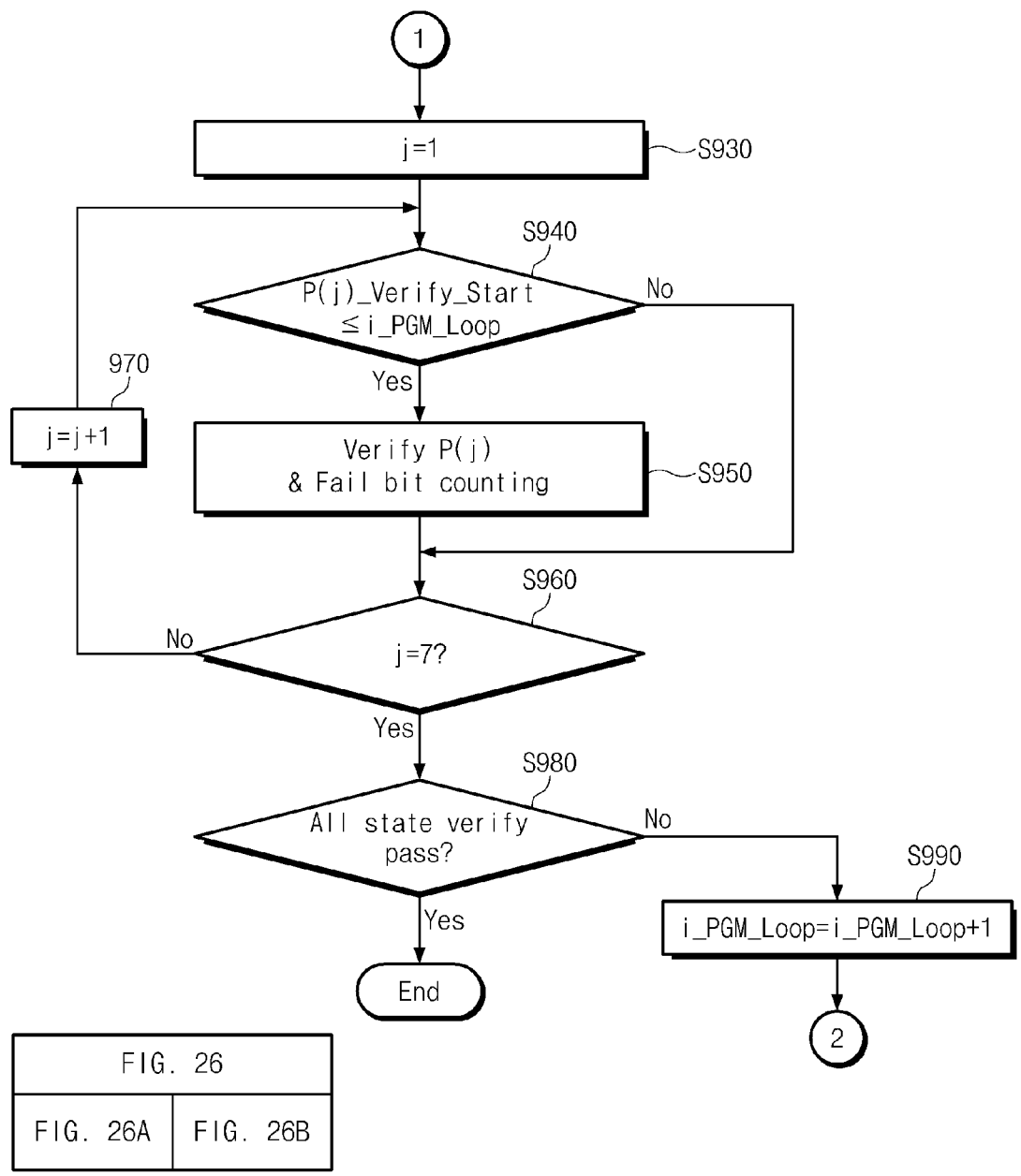

FIGS. 26A and 26B are flowcharts illustrating a method of programming a flash memory device according to yet another embodiment of the inventive concept.

In the method of FIGS. 26A and 26B, it is assumed that 3-bit data is stored in each memory cell using one erased state E and seven program states P1 through P7. In addition, the method of FIGS. 26A and 26B can use the scheme for predicting the verification start point as described above with reference to FIG. 10 and the scheme for predicting the verification end point as described above with reference to FIG. 20. A verification operation for fast bits is skipped according to the verification start point predicting scheme, and a verification operation for slow bits is skipped according to the verification end point predicting scheme.

Referring to FIG. 26A, operation S900 is performed upon initiation of a programming operation. Operation S900 sets a variable i_PGM_Loop to '1', and sets variables P(j)_Verify_Start and P(j)_Verify_End as maximum program loop times Max_PGM_Loop. The variable i_PGM_Loop indicates a current program loop, and the variable P(j)_Verify_End indicates a verification end point for a j-th program state. Next, in operation S910, the verification start points of the program states (e.g., P1 through P7) are predicted on the basis of pass bit information (e.g., a program voltage or a program loop) that is detected in a previous page or step programming operation. More specifically, operation S910 comprises setting a variable 'j' as 1 in operation S911; predicting a verification start point of program state P2 in operation S912; determining whether 'j' has reached 7 indicating program state P7 in operation S913; and increasing 'j' by 1 where 'j' has not reached 7 (S913=No) in operation S914. Where 'j' has reached 7 (S913=Yes), the method proceeds to operation S920.

In operation S920, a programming operation is performed on selected memory cells. Then, in operation S930, 'j' is set to 1. Next, in operation S940, the method determines whether the predicted verification start point of program state P1 is less than or equal to a current program loop i_PGM_Loop. Where the current program loop i_PGM_Loop is less than the verification start point P(j)_Verify_Start of program state P1, the verification operation of program state P1 is omitted. Where the current program loop i_PGM_Loop is greater than or equal to the verification start point P(j)_Verify_Start of program state P1, the verification operation of program state P2 is performed.

Where the current program loop i_PGM_Loop is greater than or equal to the verification start point P(j)_Verify_Start of program state P1 (S940=Yes), the method proceeds to operation S950. Otherwise (S940=No), the method proceeds to operation S960.

In operation S950, a verification operation is performed for program state P1 and the number of fail bits for program state P1 is counted. Like the method of FIG. 20, where the number of fail bits for program state P1 is less than or equal to a reference value, program state P1 is deemed to be passed. Following operation S950, the method proceeds to operation S960.

In operation S960, the method determines whether 'j' has reached a value of 7 indicating program state P7. Where 'j' has not reached 7 (S960=No), operation S970 is performed to increase 'j' by 1, and the method returns to operation S940. Otherwise, (S960=Yes), the method proceeds to operation S980. In operation S980, the method determines whether all of program states P1 through P7 are passed. Where not all of program states are passed (S980=No), the variable i_PGM_Loop is increased by 1 in operation S990 and the method returns to operation S920. Otherwise (S980=Yes), the method ends.

Figure 27:
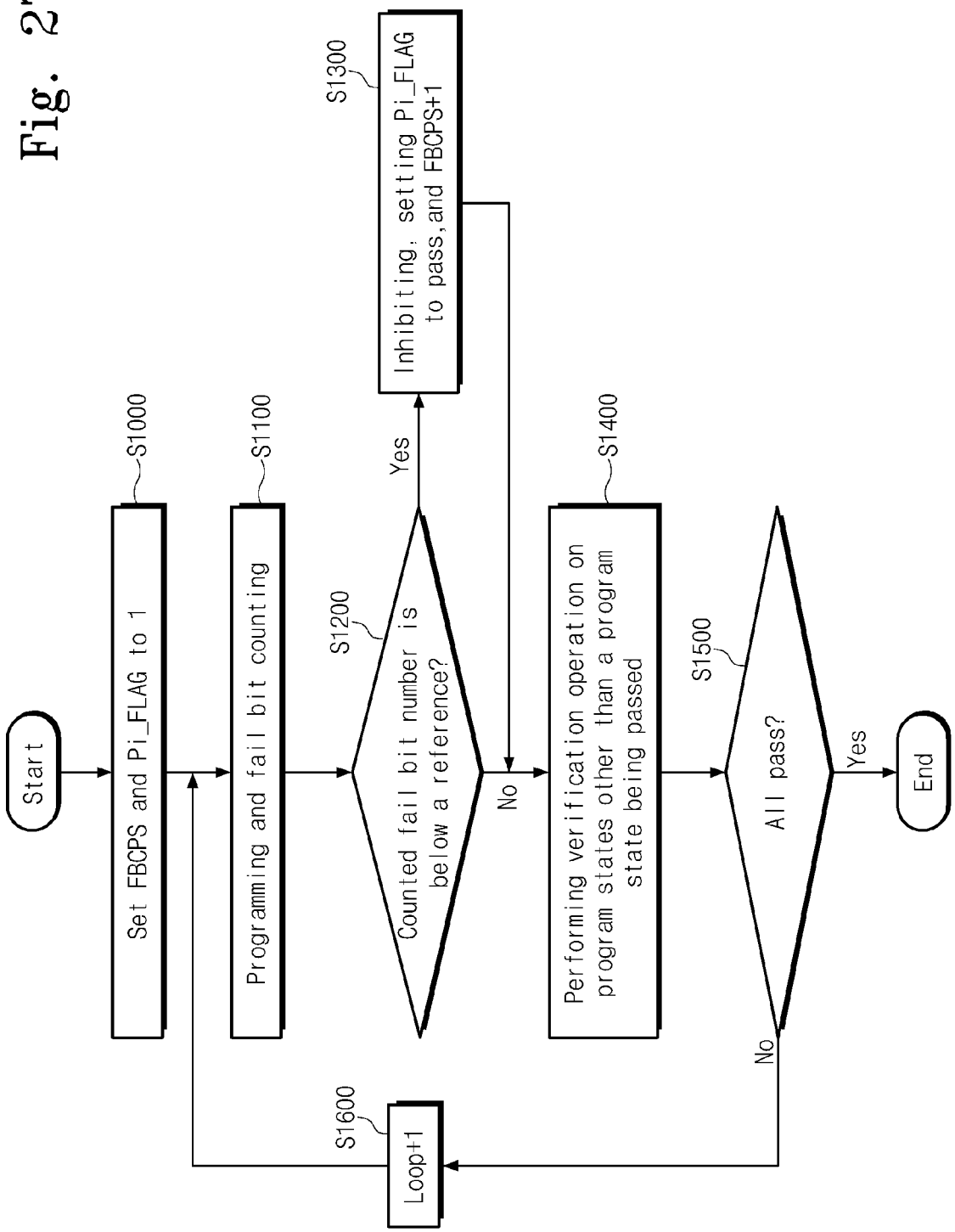
FIG. 27 is a flowchart illustrating a method of programming a flash memory device according to yet another embodiment of the inventive concept.

FIG. 27 is a flowchart illustrating a method of programming a flash memory device according to yet another embodiment of the inventive concept.

First of all, in operation S1000, variables FBCPS and Pi_FLAG are set to '1'. The variable FBCPS indicates a program state where a fail bit count operation is performed, and the variable Pi_FLAG is used to indicate the passed status of a program state where a verification operation has been performed.

A programming operation is performed in operation S1100. Further, in operation S1100, fail bit counting on a program state corresponding to a value of the variable FBCPS may be made. Assuming that a current program loop is a first program loop, the fail bit counting may be made with respect to a first program state P1. Since a current program is a first program loop, the fail bit counting may be made based on program data bits stored in a read/write circuit 500 (refer to FIG. 1). If a current program loop is a second program loop, the fail bit counting may be made based on data bits read at a verification operation of a previous program loop.

In operation S1200, there is checked whether the counted fail bit number is less than a predetermined reference value. If the counted fail bit number is less than the predetermined reference value, the method proceeds to operation S1300. In operation S1300, fail bits corresponding to the program state P1 are set to a program-inhibit value (for example, '1'). This means that memory cells corresponding to the program state P1 are program inhibited at a next program loop although a program voltage is applied to the memory cells of fail bits corresponding to the program state P 1. Further, in operation S1300, the variable Pi_FLAG is set to indicate a pass status, and the variable FBCPS is increased by 1. As the variable FBCPS is increased, fail bit counting may be made with respect to a next program state P2, instead of the program state P 1. Where the variable Pi_FLAG is set to indicate a pass status, a verification operation is omitted with respect to a program state (for example, P1) corresponding to a value of the variable Pi_FLAG. Afterwards, the method proceeds to operation S1400.

Returning to operation S1200, if the counted fail bit number is not less than the predetermined reference value, the method proceeds to operation S1400. In operation S1400, a verification operation is performed with respect to program states other than a program state being passed, respectively. For example, in the event that P1_FLAG is set to a pass status, a verification operation is performed with respect to remaining program states other than a program state P1 corresponding to the P1_FLAG, respectively. Where no program state being passed exists, a verification operation is performed with respect to all program states in operation S1400, respectively.

Operation S1500 determines whether all program states are passed. If at least one program state is not passed, the method proceeds to operation S1600, in which a program loop number is increased by 1. Afterwards, the method proceeds to operation S1100. Where all program states are passed, the method ends.

With the above-described method, a fail bit count operation is performed using a verification result of a previous program loop while a programming operation is being performed at a current program loop (or, while a program voltage is being applied to a selected word line). For this reason, although a counted fail bit number is determined to be less than a predetermined reference value, a program voltage is applied once more to memory cells corresponding to fail bits at the current program loop. As a result, that the number of fail bits corresponding to a program state to be omitted (or, skipped) is decreased.

In an exemplary embodiment, the same reference value is utilized with respect to all program states in order to judge whether each program state is passed. But, it is possible to apply different reference values to program states (or, pages in each row) in order to judge whether corresponding program states are passed.

Figure 28:
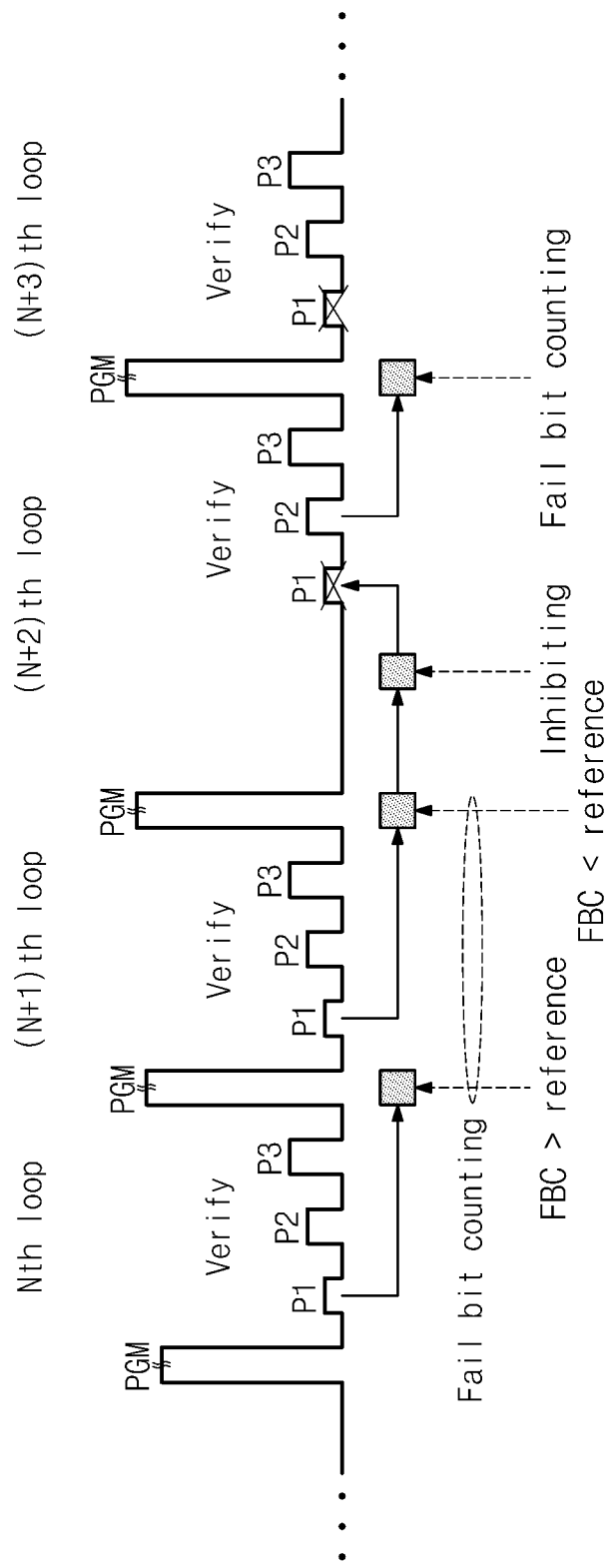
FIG. 28 is a diagram illustrating a verification scheme used in the method of FIG. 27 according to an embodiment of the inventive concept.

FIG. 28 is a diagram illustrating a verification scheme used in the method of FIG. 27 according to an embodiment of the inventive concept.

As described above, a bit count operation on a first program state P1 is performed until the number of fail bits (or, called slow bits) becomes less than a predetermined reference value. At this point, a fail bit count operation on remaining program states is not performed. A bit counting operation on a program state corresponding to a variable FBCPS is performed during a programming operation in which a program voltage is applied to selected memory cells.

For example, as illustrated in FIG. 28, a verification operation is performed with respect to program states P1, P2, and P3 at an Nth program loop. A fail bit count operation on the program state P1 is performed during a programming operation of a (N+1)th program loop, based on data bits corresponding to the program state P1 read at a verification operation of the Nth program loop. If a counted fail bit number FBC is more than a predetermined reference value, a fail bit count operation on the program state P1 is again performed during a programming operation of a (N+2)th program loop. If the counted fail bit number FBC is determined to be less than the predetermined reference value at the (N+2)th program loop, fail bits among data bits corresponding to the program state P1 are set to a program-inhibit value, and a verification operation on the program state P1 is omitted after the following program loops including a current program loop (for example, the (N+2)th program loop). When the program state P1 is passed, as illustrated in FIG. 28, a fail bit count operation is performed with respect to a next program state P2.

As understood from the above description, a program voltage is applied to memory cells corresponding to fail bits once more after a counted fail bit number is determined to be less than a predetermined reference value. This means that the number of fail bits corresponding to a program state to be omitted (or, skipped) is decreased.

In an exemplary embodiment, in case of the highest program state, if a counted fail bit number is determined to be less than a predetermined reference value, it is possible to prevent a further program voltage from being applied to memory cells corresponding to fail bits.

Figure 29:
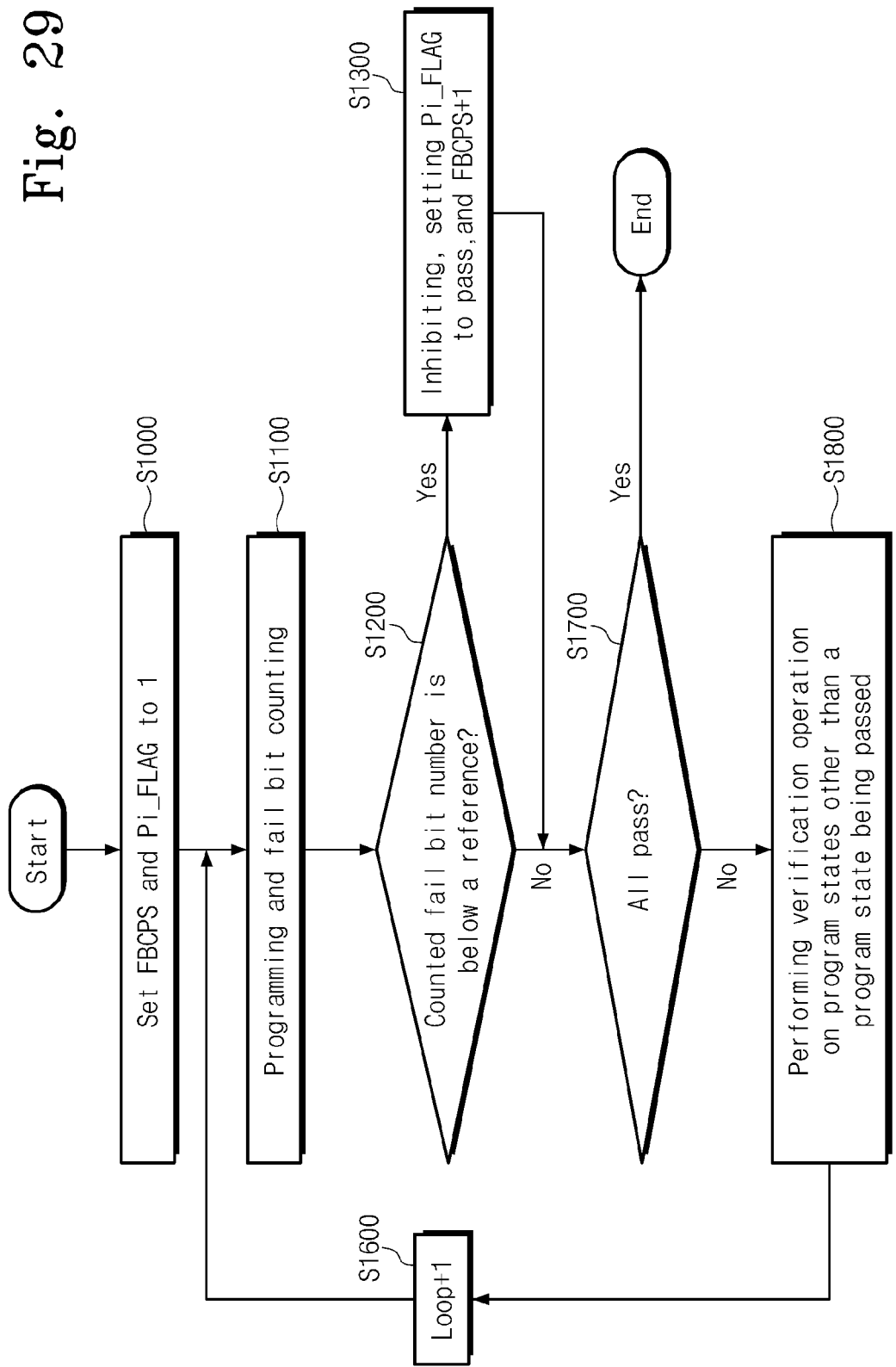
FIG. 29 is a flowchart illustrating a method of programming a flash memory device according to yet another embodiment of the inventive concept.

FIG. 29 is a flowchart illustrating a method of programming a flash memory device according to yet another embodiment of the inventive concept.

A program method in FIG. 29 is substantially identical to that illustrated in FIG. 27 except that step S1700 of judging whether all program states are passed can be made before step S1800 of performing verification operation on program states other than a program state being passed. Description for a program method in FIG. 29 is thus omitted.

Figure 30:
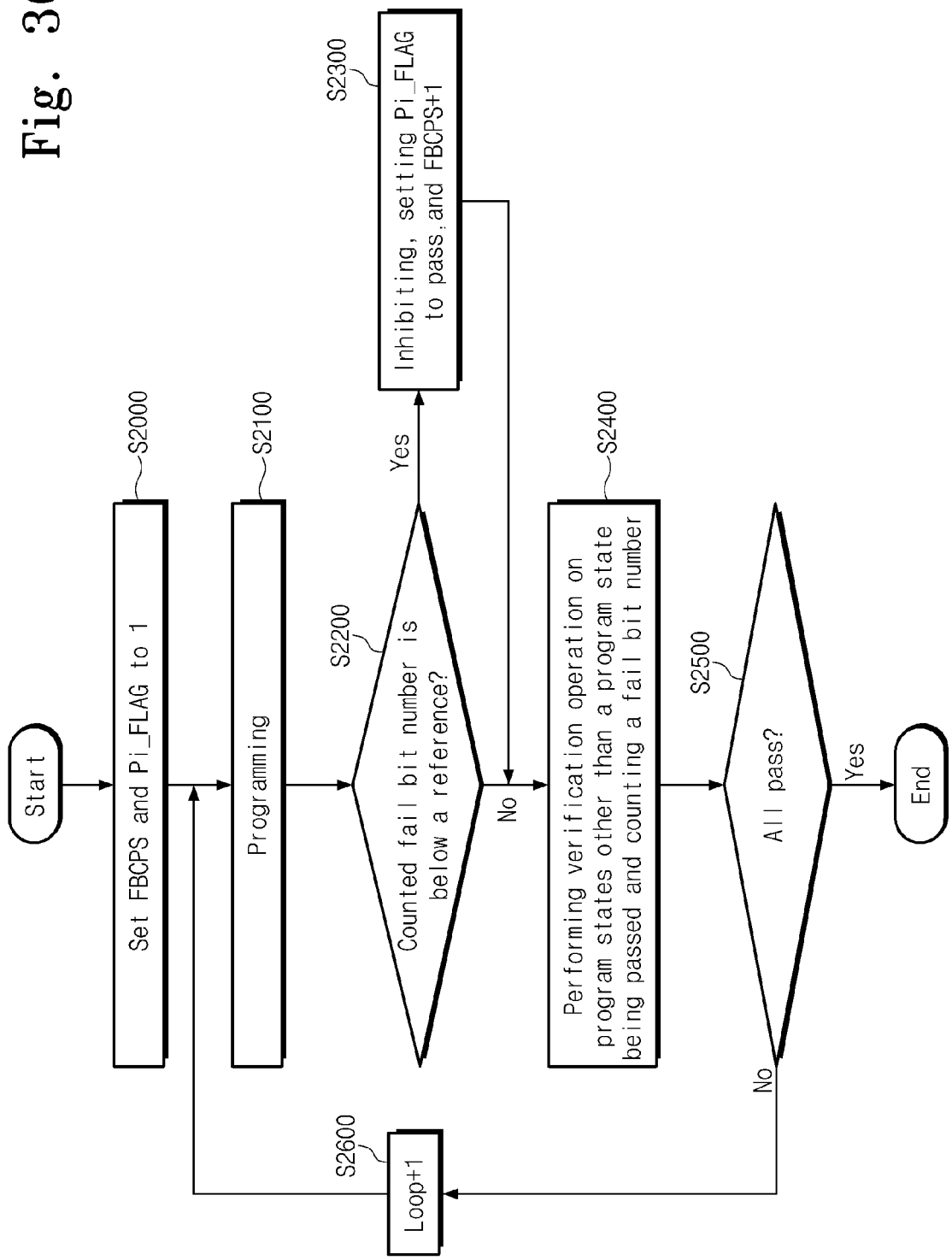
FIG. 30 is a flowchart illustrating a method of programming a flash memory device according to yet another embodiment of the inventive concept.

FIG. 30 is a flowchart illustrating a method of programming a flash memory device according to yet another embodiment of the inventive concept.

First of all, in operation S2000, variables FBCPS and Pi_FLAG are set to '1'. The variable FBCPS indicates a program state where a fail bit count operation is performed, and the variable Pi_FLAG is used to indicate the passed status of a program state where a verification operation has been performed.

A programming operation is performed in operation S2100. In operation S2200, there is checked whether a counted fail bit number is less than a predetermined reference value. As will be described later, the counted fail bit number is maintained by control logic 400 in FIG. 1. As a fail bit number of a previous program loop, for example, the counted fail bit number may be set to a default value more than a predetermined reference value. If the counted fail bit number is less than the predetermined reference value, the method proceeds to operation S2300. In operation S2300, fail bits corresponding to the program state P1 are set to a program-inhibit value (for example, '1'). This means that memory cells corresponding to the program state P1 are program inhibited at a next program loop although a program voltage is applied to the memory cells of fail bits corresponding to the program state P1. Further, in operation S2300, the variable Pi_FLAG is set to indicate a pass status, and the variable FBCPS is increased by 1. As the variable FBCPS is increased, a fail bit counting may be made with respect to a next program state P2, instead of the program state P1. Where the variable Pi_FLAG is set to indicate a pass status, a verification operation is omitted with respect to a program state (for example, P1) corresponding to a value of the variable Pi_FLAG. Afterwards, the method proceeds to operation S2400.

Returning to operation S2200, if the counted fail bit number is not less than the predetermined reference value, the method proceeds to operation S2400. In operation S2400, a verification operation is performed with respect to program states other than a program state being passed, respectively.

For example, in the event that P1_FLAG is set to a pass status, a verification operation is performed with respect to remaining program states other than a program state P1 corresponding to the P1_FLAG, respectively. Where no program state being passed exists, a verification operation is performed with respect to all program states in operation S2400, respectively. Further, in operation 2400, a fail bit count operation is performed on a program state corresponding to the variable FBCPS. The counted fail bit number is stored in the control logic 400. The counted fail bit number is used as a fail bit number of a previous program loop in operation S2200.

Operation S2500 determines whether all program states are passed. If at least one program state is not passed, the method proceeds to operation S2600, in which a program loop number is increased by 1. Afterwards, the method proceeds to operation S1100. Where all program states are passed, the method ends.

With the above-described method, a verification operation on a program state is omitted using a verification result of a previous program loop after a programming operation is performed at a current program loop. For this reason, although a counted fail bit number is determined to be less than a predetermined reference value, a program voltage is further applied to memory cells corresponding to fail bits at the current program loop. As a result, that the number of fail bits corresponding to a program state to be omitted (or, skipped) is decreased.

In an exemplary embodiment, the same reference value is utilized with respect to all program states in order to judge whether each program state is passed. But, it is possible to apply different reference values to program states (or, pages in each row) in order to judge whether corresponding program states are passed.

Figure 31:
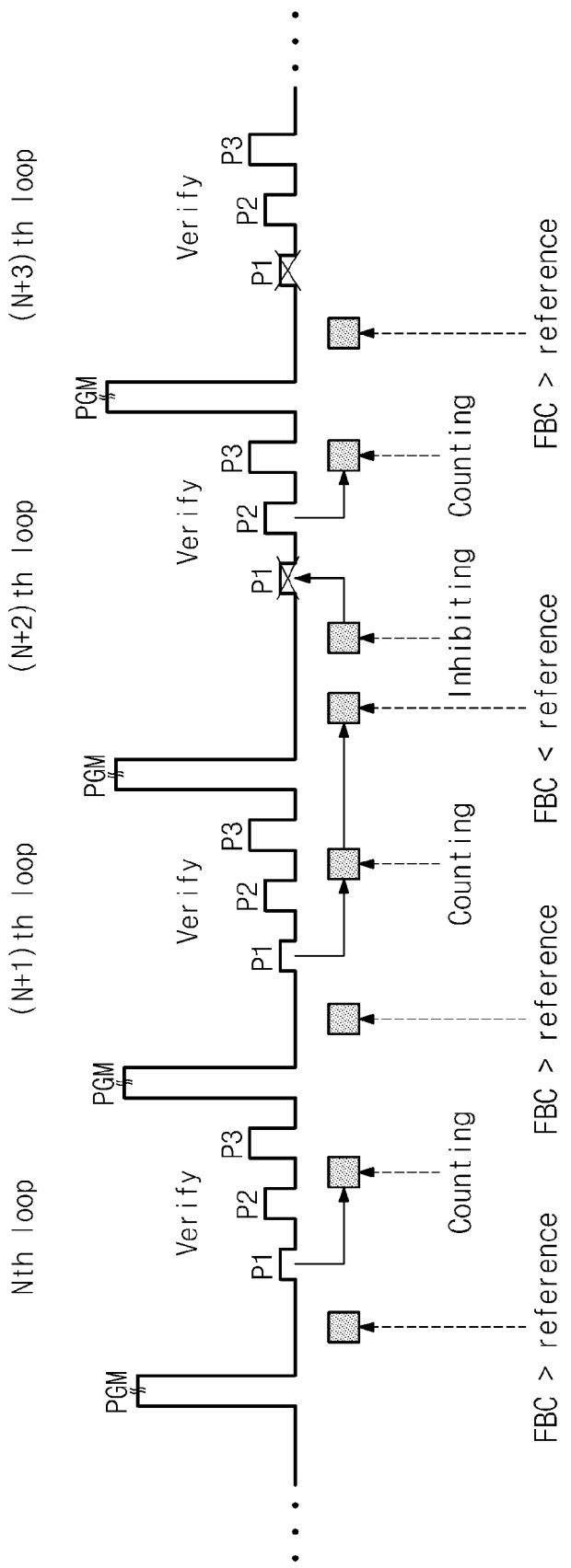
FIG. 31 is a diagram illustrating a verification scheme used in the method of FIG. 30 according to an embodiment of the inventive concept.

FIG. 31 is a diagram illustrating a verification scheme used in the method of FIG. 29 according to an embodiment of the inventive concept.

As described above, a bit count operation on a first program state P1 is performed until the number of fail bits (or, called slow bits) becomes less than a predetermined reference value. At this point, a fail bit count operation on remaining program states is not performed. A bit counting operation on a program state corresponding to a variable FBCPS is performed during a programming operation in which a program voltage is applied to selected memory cells.

For example, first of all, a program voltage is applied to selected memory cells. And then, as illustrated in FIG. 31, whether a fail bit number is less than a predetermined reference value is checked before a verification operation is performed. If the fail bit number is not less than the predetermined reference value, a verification operation is performed with respect to program states P1, P2, and P3 at an Nth program loop. A fail bit count operation on the program state P1 is performed during the Nth program loop, based on data bits corresponding to the program state P1 read at a verification operation of the Nth program loop. The counted fail bit number may be retained by control logic 400 in FIG. 1.

If a (N+1)th program loop is performed, a program voltage is applied to selected memory cells. And then, whether a fail bit number is less than a predetermined reference value is checked before a verification operation of the (N+1)th program loop is performed. The counted fail bit number may be retained by the control logic 400 in FIG. 1.

If the counted fail bit number FBC is determined to be less than the predetermined reference value at the (N+2)th program loop, fail bits among data bits corresponding to the program state P1 are set to a program-inhibit value, and a verification operation on the program state P1 is omitted after the following program loops including a current program loop (for example, the (N+2)th program loop). As the program state P1 is passed, as illustrated in FIG. 31, a fail bit count operation is performed with respect to a next program state P2.

As understood from the above description, a program voltage is applied to memory cells corresponding to fail bits once more after a counted fail bit number is determined to be less than a predetermined reference value. This means that the number of fail bits corresponding to a program state to be omitted (or, skipped) is decreased.

In an exemplary embodiment, in case of the highest program state, if a counted fail bit number is determined to be less than a predetermined reference value, it is possible to prevent a further program voltage from being applied to memory cells corresponding to fail bits.

Figure 32:
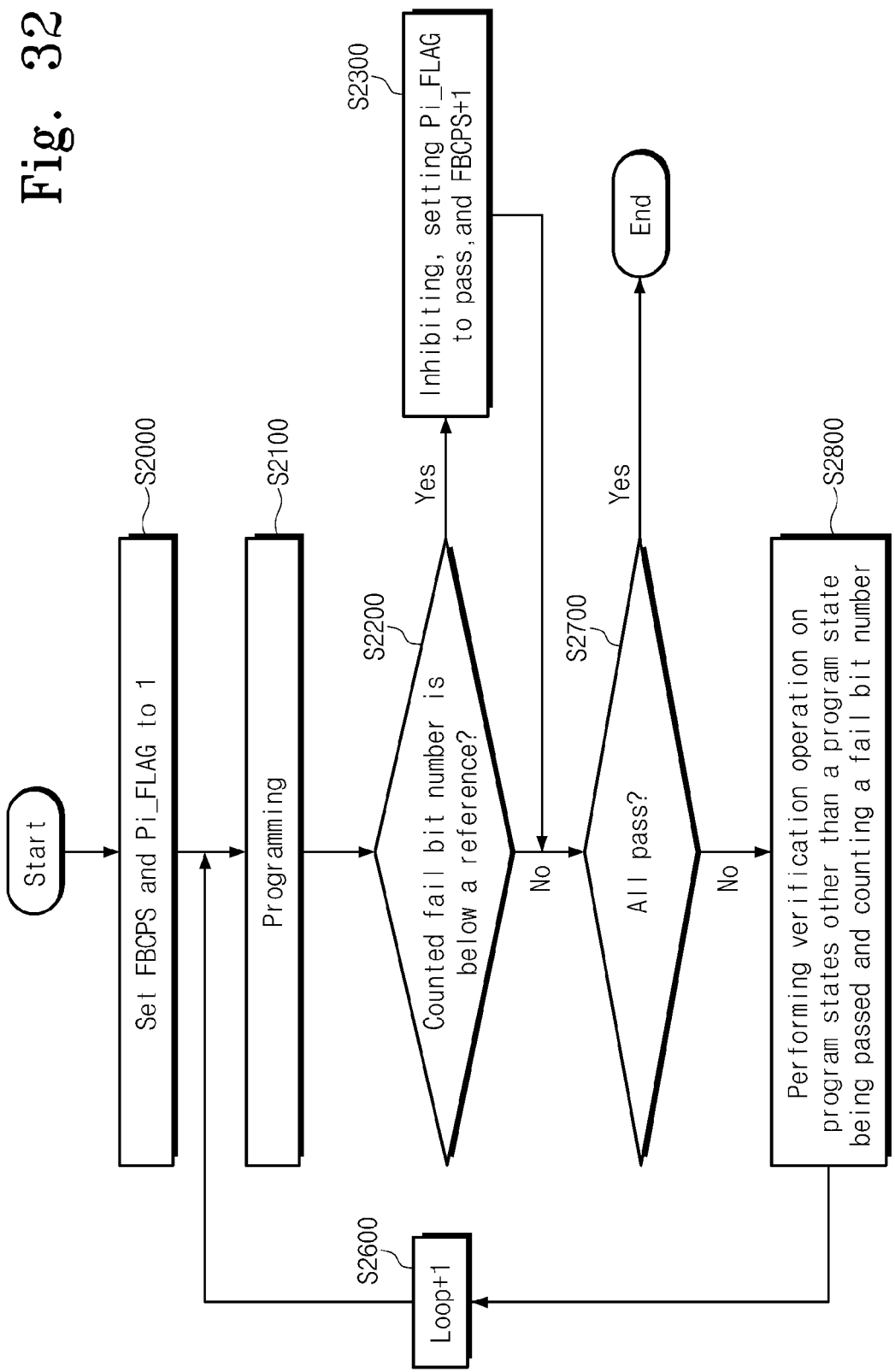
FIG. 32 is a flowchart illustrating a method of programming a flash memory device according to yet another embodiment of the inventive concept.

FIG. 32 is a flowchart illustrating a method of programming a flash memory device according to yet another embodiment of the inventive concept.

A program method in FIG. 32 is substantially identical to that illustrated in FIG. 30 except that operation S2700 of judging whether all program states are passed can be made before operation S2800 of performing verification operation on program states other than a program state being passed. Description for a program method in FIG. 32 is thus omitted.

As described in FIGS. 16 to 21 and 27 to 30, there is omitted (or, skipped) a verification operation for a program state determined to be passed. This means that although a program voltage is applied to a word line, memory cells corresponding to the program state(s) determined to be passed are program inhibited. In other words, program Inhibiting of memory cells corresponding to a slow bit (or a fail bit) may be made in two manners: the first program inhibiting manner being described in FIGS. 16 to 21 and the second program inhibiting manner being described in FIGS. 27 to 30.

Figure 33:
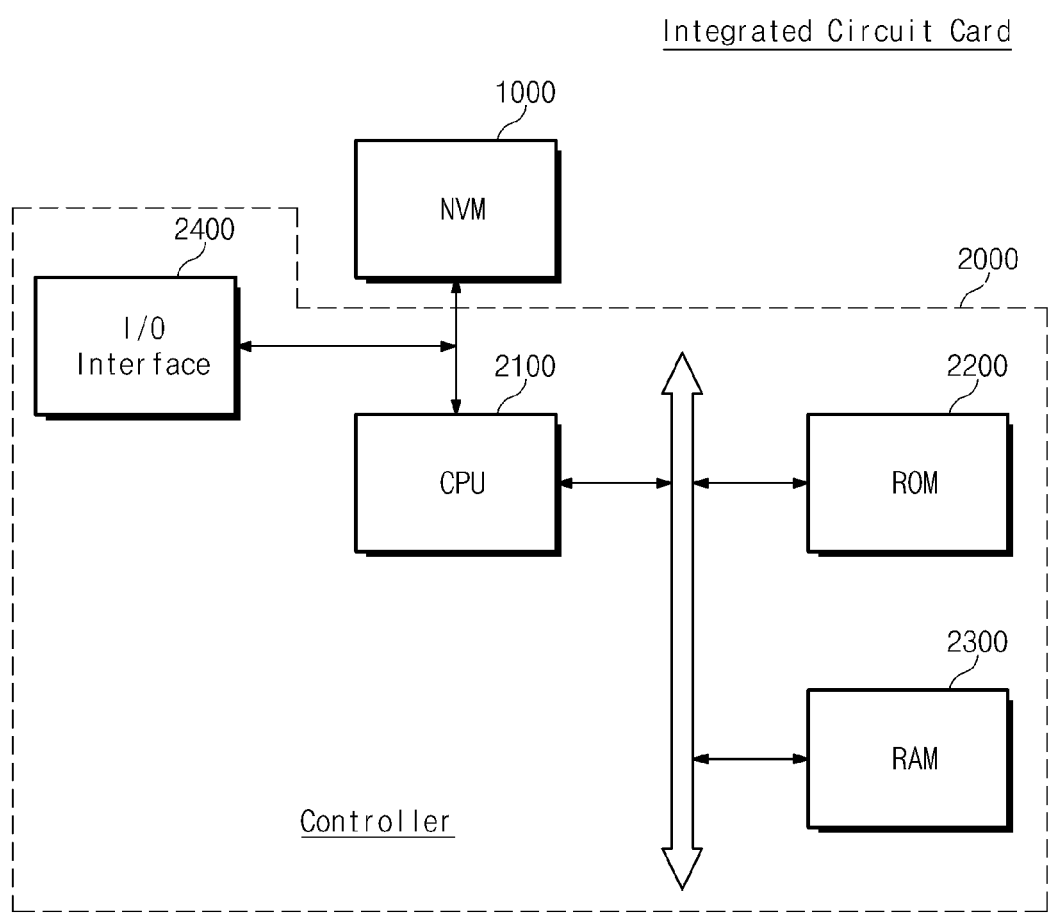
FIG. 33 is a block diagram illustrating an integrated circuit card comprising a flash memory device according to an embodiment of the inventive concept.

FIG. 33 is a block diagram illustrating an integrated circuit card comprising a flash memory device according to an embodiment of the inventive concept.

Referring to FIG. 33, an integrated circuit, such as a smart card, comprises a nonvolatile memory device 1000 and a controller 2000. Nonvolatile memory device 1000 is the substantially same as that illustrated in FIG. 1, and so a detailed description thereof will be omitted in order to avoid redundancy. Controller 2000 controls nonvolatile memory device 1000 and comprises a central processing unit (CPU) 2100, a read only memory (ROM) 2200, a random access memory (RAM) 2300, and an input/output (I/O) interface 2400. CPU 2100 controls the overall operation of the integrated circuit card according to various programs stored in ROM 2200, and input/output interface 2400 interfaces with external devices. Controller 2000 stores information indicating a pass bit that is detected during the programming operation of nonvolatile memory device 1000 and provides the information indicating the detected pass bit to nonvolatile memory device 1000. The information can be used to determine verification start points in one or more of the above-described methods.

Figure 34:
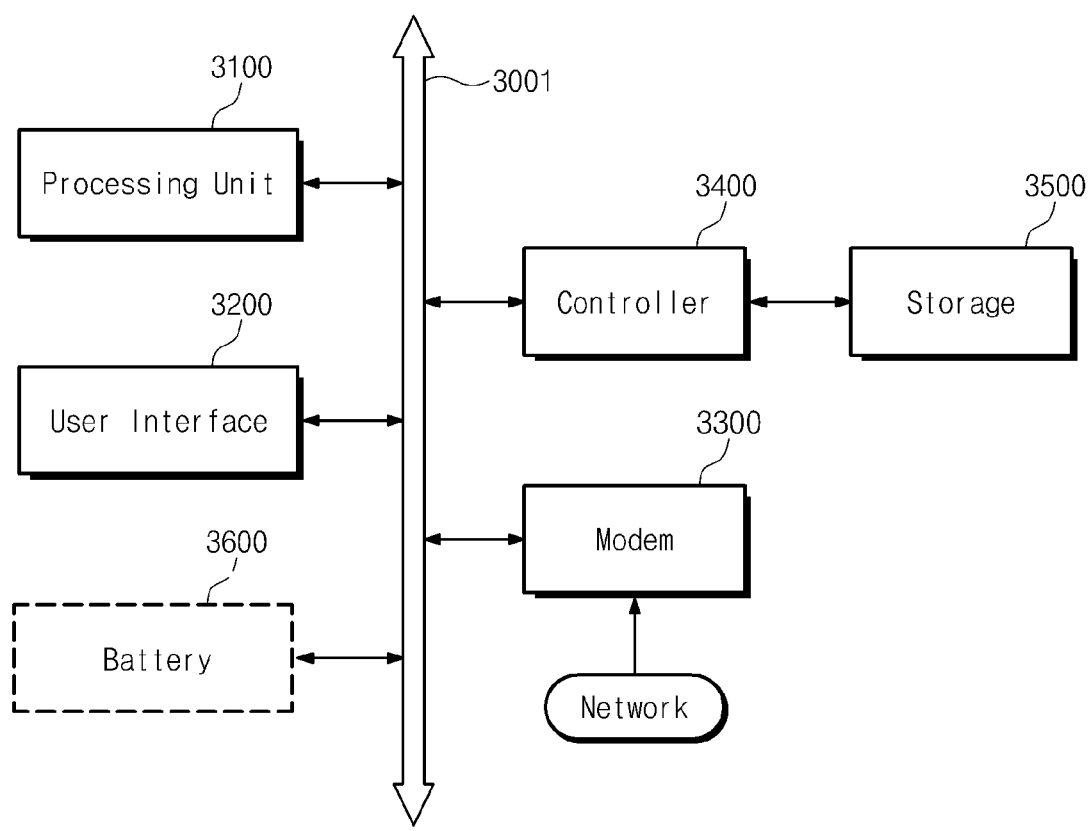
FIG. 34 is a block diagram illustrating a computing system comprising a flash memory device according to an embodiment of the inventive concept.

FIG. 34 is a diagram illustrating a computing system comprising a flash memory device according to an embodiment of the inventive concept. The computing system can take a variety of forms, such as a cellular phone, personal digital assistant, digital camera, portable game console, MP3 player, high definition television, digital video disk, router, global positioning system (GPS), and many others.

Referring to FIG. 34, the computing system comprises a processing unit 3100, a user interface 3200, a modem 3300 such as a baseband chipset, a memory controller 3400, and a flash memory device 3500, which are electrically connected to each other via a bus 3001. Flash memory device 3500 is substantially the same as the flash memory device of FIG. 1 and performs a programming operation using an adaptive verification scheme, such as those described above. Accordingly, a further description of flash memory device 3500 will be omitted to avoid redundancy. N-bit data (N≥1), which has been processed or is to be processed by processing unit 3100, is stored in flash memory device 3500 through memory controller 3400. Where the computing system is a mobile device, it may further comprise a battery 3600 for supplying the operation voltage of the computing system. Although not shown, the computing system can further comprise an application chipset, a camera image processor (CIS), or a mobile dynamic random access memory (DRAM). The memory controller and the flash memory device can form a solid state drive (SSD) that uses a nonvolatile memory for storing data.

Figure 35:
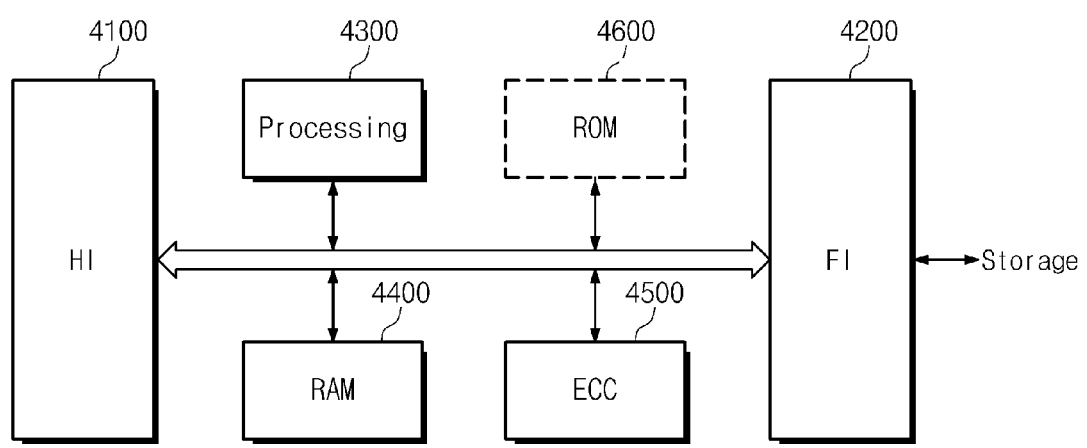
FIG. 35 is a block diagram illustrating a memory controller of the computing system of FIG. 34 according to an embodiment of the inventive concept.

FIG. 35 is a block diagram illustrating memory controller 3400 of FIG. 32 according to an embodiment of the inventive concept.

Referring to FIG. 35, memory controller 3400 stores data in a storage medium and reads data from the storage medium. The controller comprises a host interface 4100, a memory interface 4200, a processing unit 4300, a buffer memory 4400, and an error correction code unit 4500. Host interface 4100 interfaces with external devices, such as a host, and memory interface 4200 interfaces with the storage medium. Processing unit 4300 controls the overall operation of memory controller 3400. Buffer memory 4400 temporarily stores data to be stored in the storage medium or data that is read from the storage medium. Buffer memory 4400 can also be used as the working memory of processing unit 4300. Buffer memory 4400 can be used to store pass bit information that is output from a flash memory device. Error correction code unit 4500 detects and corrects errors in data that is read from the storage medium. Memory controller 3400 further comprises a ROM 4600 for storing code data.

In some embodiments, memory cells are configured with variable resistance memory cells. Examples of variable resistance memory cells and memory devices including variable resistance memory cells are disclosed in U.S. Pat. No. 7,529,124, which is hereby incorporated by reference.

In some embodiments, memory cells are implemented using one of various cell structures having a charge storage layer. A cell structure having a charge storage layer can include, for instance, a charge trapping flash structure using a charge trapping layer, a stack flash structure comprising arrays stacked in multi layers, a flash structure having no source-drain, and a pin-type flash structure. Examples of memory devices having a charge trapping flash structure as a charge storage layer are disclosed in U.S. Pat. No. 6,858,906, U.S. Patent Publication No. 2004-0169238, and U.S. Patent Publication No. 2006-0180851, which are hereby incorporated by reference. An example of a flash structure having no source-drain is disclosed in Korea Patent No. 673,020, which is hereby incorporated by reference.

Devices according to various embodiments of the inventive concept can be mounted in any of several types of packages. For example, the above-described flash memory devices and/or memory controllers can be mounted in package types such as package on package (PoP), ball grid arrays (BGAs), chip scale package (CSP), plastic leaded chip carrier (PLCC), plastic dual in-line package (PDIP), die in waffle pack (DIWP), die in wafer form (DIWF), chip on board (COB), ceramic dual in-line package (CERDIP), plastic metric quad flat pack (MQFP), small outline package (SOP), shrink small outline package (SSOP), thin small outline package (TSOP), thin quad flat pack (TQFP), system in package (SIP), multi-chip package (MCP), wafer-level stack package (WLSP), die in wafer form (DIWF), die on waffle package (DOWP), wafer-level fabricated package (WFP) and wafer-level processed stack package (WSP).

As indicated by the foregoing, in various embodiments of the inventive concept, by omitting verification operations before verification start points corresponding to programming states, programming performance can be improved. Moreover, by omitting verification operations after verification end points of programming states, programming performance can be improved.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of programming a nonvolatile memory device, comprising:
   applying a program voltage to selected memory cells;
   performing a first verification operation for a first program state by applying a first verification voltage to the selected memory cells;
   performing a second verification operation for a second program state by applying a second verification voltage to the selected memory cells;
   performing a first fail-bit counting operation for a result of the first verification operation; and
   selectively performing a second fail-bit counting operation for a result of the second verification operation based on a result of the first fail-bit counting operation,
   wherein the second verification voltage is higher than the first verification voltage.

2. The method of claim 1, wherein the second fail-bit counting operation is performed when the result of the first fail-bit counting operation is lower than a reference value, and the second fail-bit counting operation is not performed when the result of the first fail-bit counting operation is higher than the reference value.

3. The method of claim 2, wherein the reference value has a same value for the first program state and the second program state.

4. The method of claim 1, wherein the applying of the program voltage to the selected memory cells, the first verification operation, the second verification operation and the first fail-bit counting operation form a program loop which is repeated a plurality of times.

5. The method of claim 4, wherein the first verification operation is omitted in next program loop when the result of the first fail-bit counting operation is lower than a reference value.

6. A method of programming a nonvolatile memory device, comprising:
   applying a first program voltage to selected memory cells;
   performing a first verification operation for a first program state by applying a first verification voltage to the selected memory cells;
   applying a second program voltage to the selected memory cells; and
   performing a first fail-bit counting operation for program fail-bits based on a result of the first verification operation during applying of the second program voltage to the selected memory cells.

7. The method of claim 6, further comprising performing a second verification operation for a second program state by applying a second verification voltage which is higher than the first verification voltage to the selected memory cells.

8. The method of claim 7, further comprising selectively performing a second fail-bit counting operation for a result of the second verification operation based on a result of the first fail-bit counting operation.

9. The method of claim 8, wherein the second fail-bit counting operation is performed when the result of the first fail-bit counting operation is lower than a reference value, and the second fail-bit counting operation is not performed when the result of the first fail-bit counting operation is higher than the reference value.

10. The method of claim 7, wherein the applying of the first program voltage to the selected memory cells, the first verification operation and the second verification operation form a program loop which is repeated a plurality of times.

11. The method of claim 10, wherein the first verification operation is omitted in a next program loop when the result of the first fail-bit counting operation is lower than a reference value.

12. The method of claim 10, wherein memory cells corresponding to the program fail-bits are program inhibited in a next program loop when a result of the first fail-bit counting operation is lower than a reference value.

13. The method of claim 11, wherein the reference value has a same value for the first program state and the second program state.

14. The method of claim 12, wherein the reference value has a same value for the first program state and the second program state.

15. The method of claim 11, wherein the reference value has a different value for the first program state and the second program state.

16. The method of claim 12, wherein the reference value has a different value for the first program state and the second program state.

17. The method of claim 6, wherein the second program voltage is higher than the first program voltage.

* * * * *